(12) United States Patent
Bryant et al.

(10) Patent No.: US 6,677,645 B2
(45) Date of Patent: Jan. 13, 2004

(54) BODY CONTACT MOSFET

(75) Inventors: Andres Bryant, Essex Junction, VT (US); Peter E. Cottrell, Essex Junction, VT (US); John J. Ellis-Monaghan, Grand Isle, VT (US); Robert J. Gauthier, Jr., Hinesburg, VT (US); Edward J. Nowak, Essxe Junction, VT (US); Jed H. Rankin, South Burlington, VT (US); Fariborz Assaderaghi, San Diego, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/061,263

(22) Filed: Jan. 31, 2002

(65) Prior Publication Data

US 2003/0141543 A1 Jul. 31, 2003

(51) Int. Cl.⁷ .................... H01L 27/01; H01L 27/12; H01L 31/0392
(52) U.S. Cl. .................................................. 257/347
(58) Field of Search .................. 257/347, 348, 257/349, 350, 351, 352, 353, 354

(56) References Cited

U.S. PATENT DOCUMENTS

| | | | |
|---|---|---|---|
| 4,577,390 A | * | 3/1986 | Haken |
| 4,965,213 A | | 10/1990 | Blake |
| 5,079,605 A | | 1/1992 | Blake |
| 5,089,870 A | * | 2/1992 | Haond |
| 5,126,817 A | * | 6/1992 | Baba et al. |
| 5,145,802 A | | 9/1992 | Tyson et al. |
| 5,160,989 A | | 11/1992 | Houston |
| 5,185,280 A | | 2/1993 | Houston et al. |
| 5,298,773 A | | 3/1994 | Woodruff |
| 5,317,181 A | | 5/1994 | Tyson |
| 5,324,683 A | * | 6/1994 | Fitch et al. |
| 5,424,225 A | | 6/1995 | Yamaguchi et al. |
| 5,489,792 A | * | 2/1996 | Hu et al. |
| 5,559,368 A | | 9/1996 | Hu et al. |
| 5,811,855 A | | 9/1998 | Tyson et al. |
| 5,818,085 A | | 10/1998 | Hsu et al. |
| 5,821,575 A | | 10/1998 | Mistry et al. |
| 5,831,320 A | | 11/1998 | Kwon et al. |
| 5,872,383 A | * | 2/1999 | Yagishita |
| 5,929,490 A | | 7/1999 | Onishi |
| 5,930,605 A | | 7/1999 | Mistry et al. |
| 5,962,895 A | | 10/1999 | Beyer et al. |
| 5,973,364 A | | 10/1999 | Kawanaka |
| 5,982,003 A | | 11/1999 | Hu et al. |
| 6,084,255 A | | 7/2000 | Ueda et al. |
| 6,261,921 B1 | * | 7/2001 | Yen et al. |
| 6,281,593 B1 | * | 8/2001 | Brown et al. |
| 6,344,671 B1 | * | 2/2002 | Mandelman et al. |

FOREIGN PATENT DOCUMENTS

JP          64-30851          2/1989

* cited by examiner

Primary Examiner—Nathan J. Flynn
Assistant Examiner—Kevin Quinto
(74) Attorney, Agent, or Firm—Schmeiser, Olsen & Watts; Mark F. Chadurjian

(57) ABSTRACT

A body contact structure utilizing an insulating structure between the body contact portion of the active area and the transistor portion of the active area is disclosed. In one embodiment, the present invention substitutes an insulator for at least a portion of the gate layer in the regions between the transistor and the body contact. In another embodiment, a portion of the gate layer is removed and replaced with an insulative layer in regions between the transistor and the body contact. In still another embodiment, the insulative structure is formed by forming multiple layers of gate dielectric between the gate and the body in regions between the transistor and the body contact. The body contact produced by these methods adds no significant gate capacitance to the gate.

11 Claims, 32 Drawing Sheets

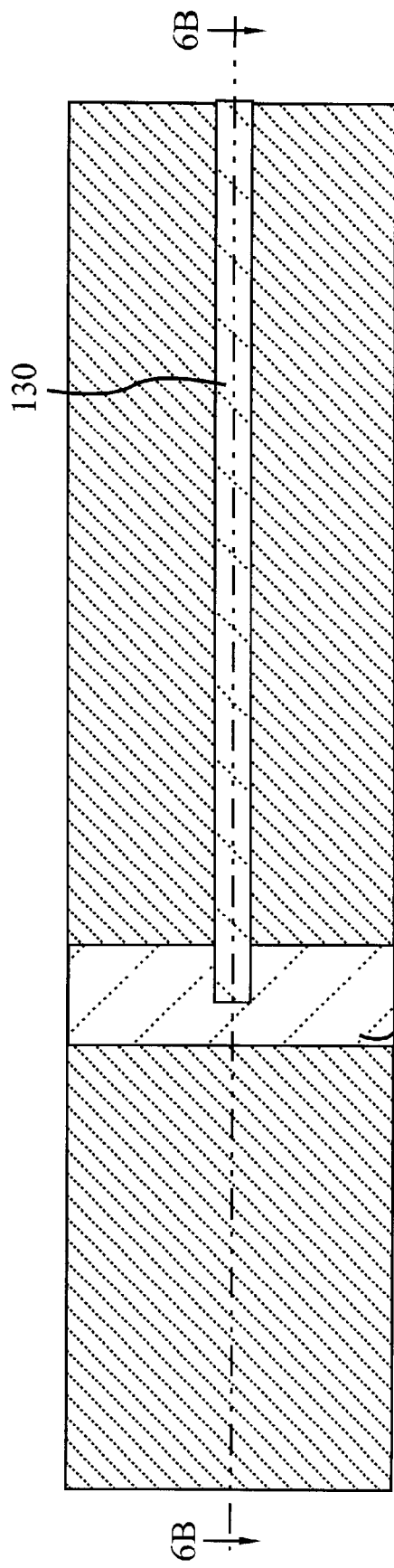
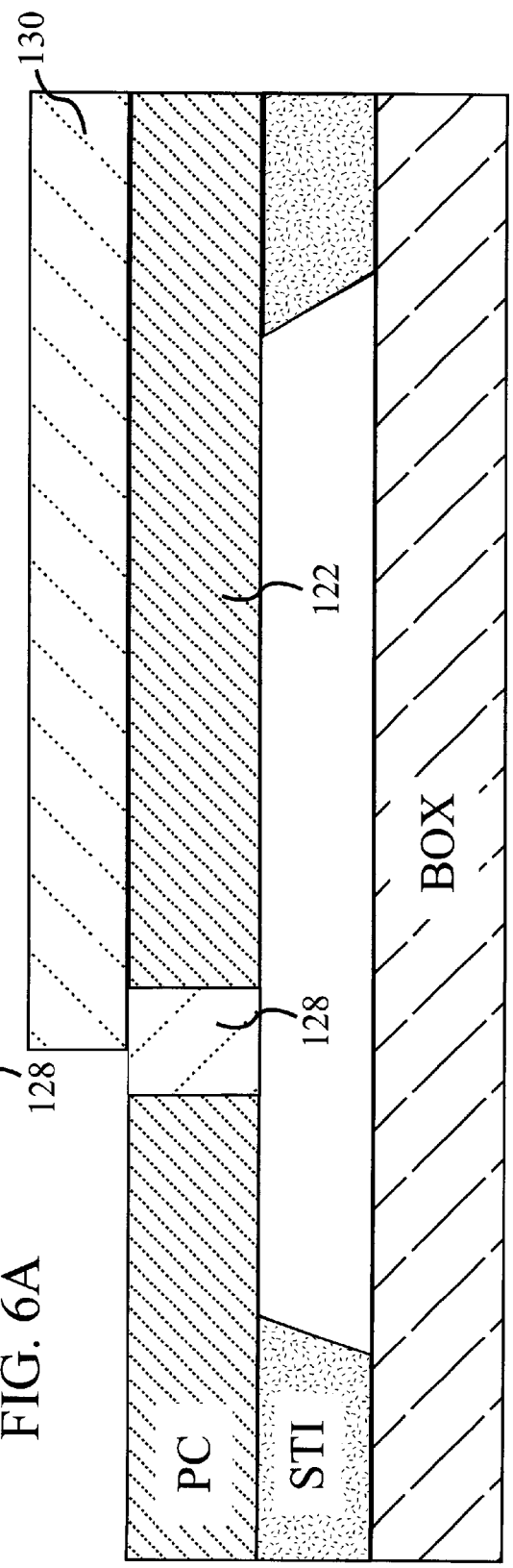
FIG. 6A
FIG. 6B

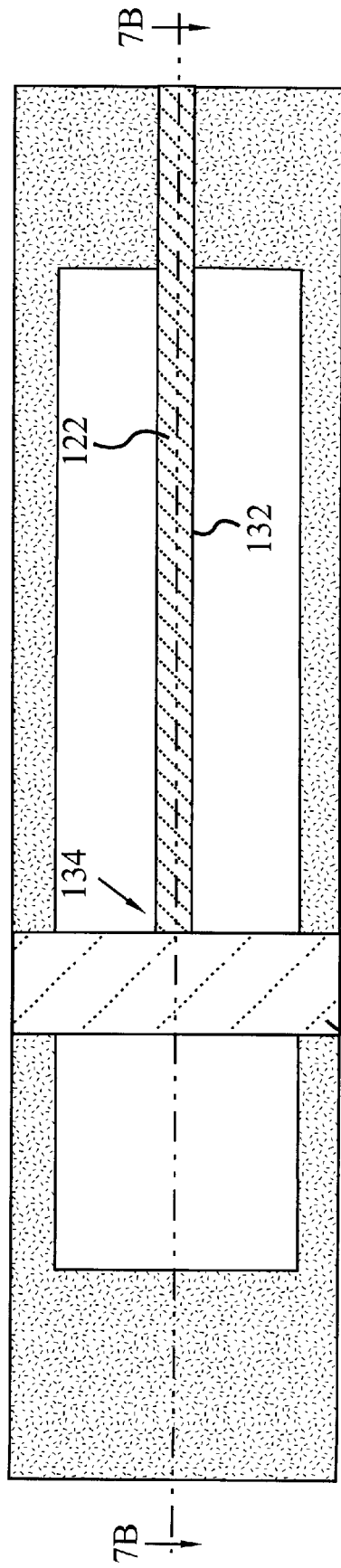

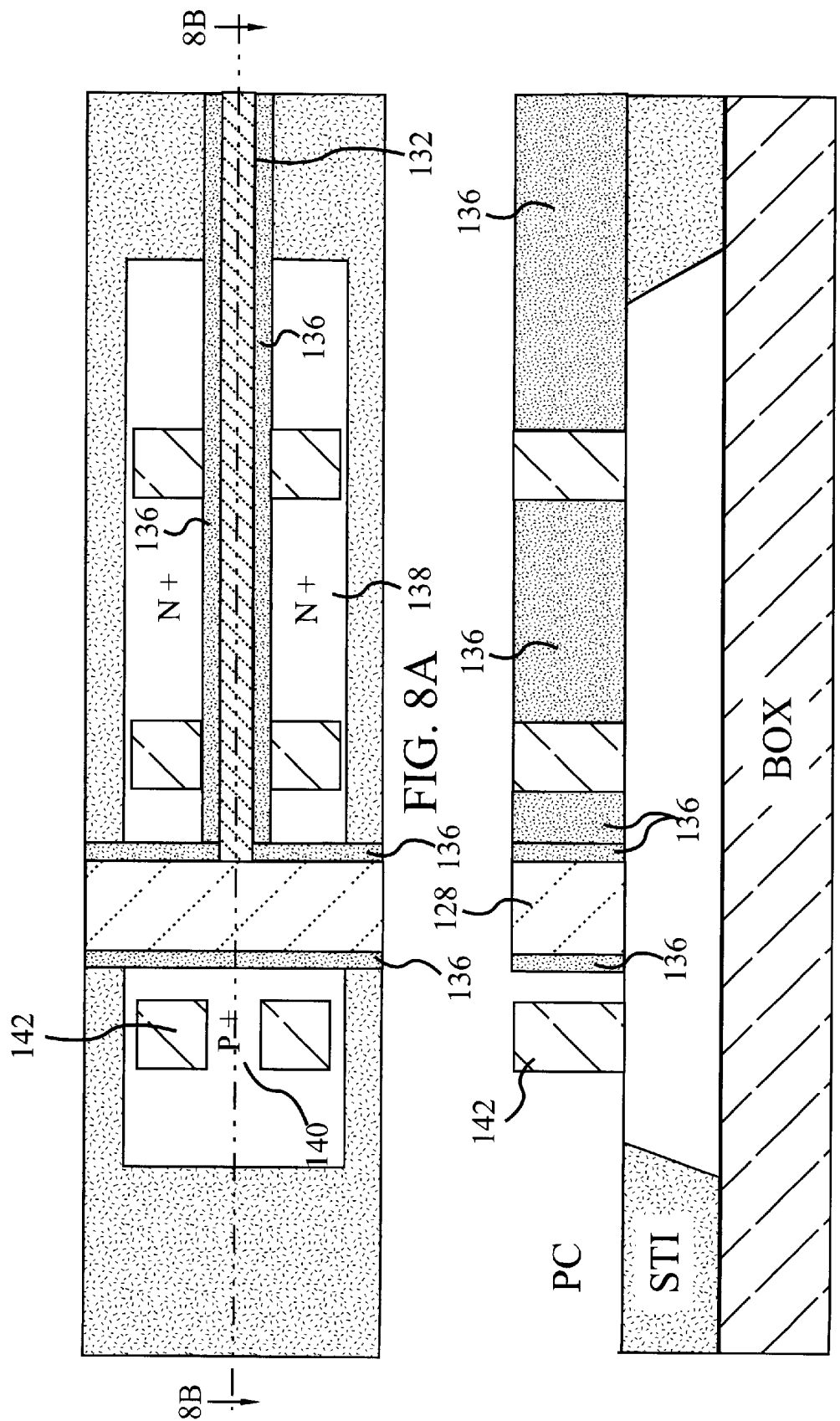

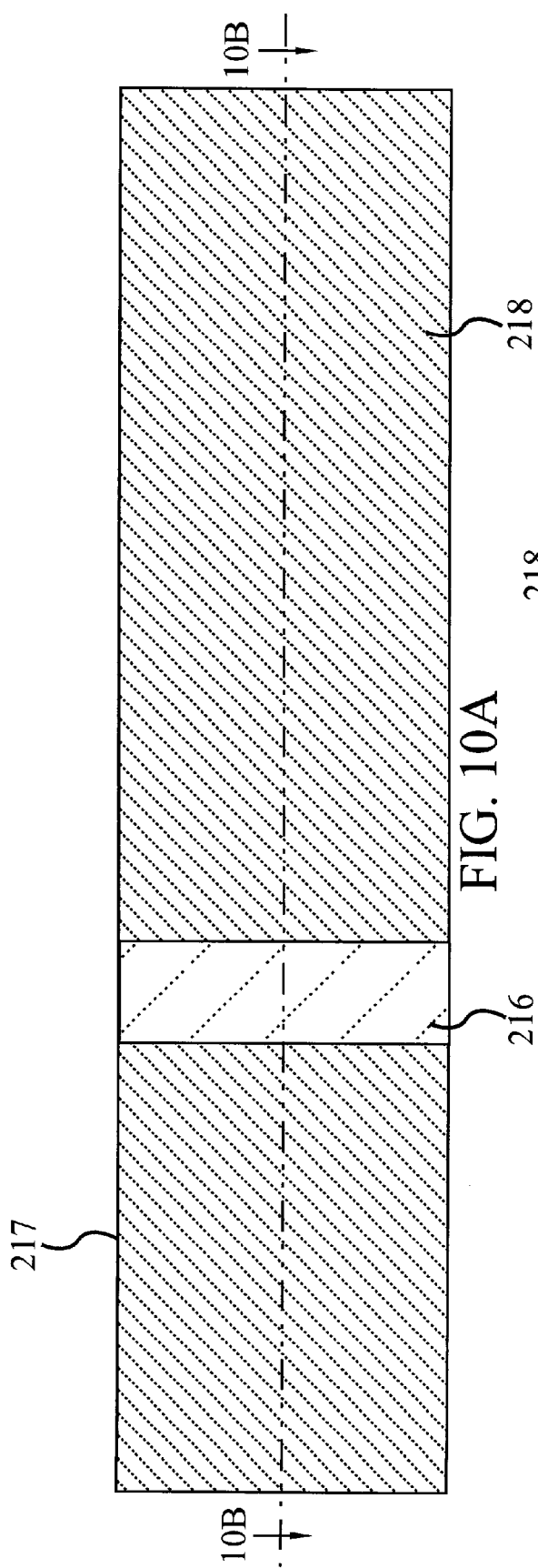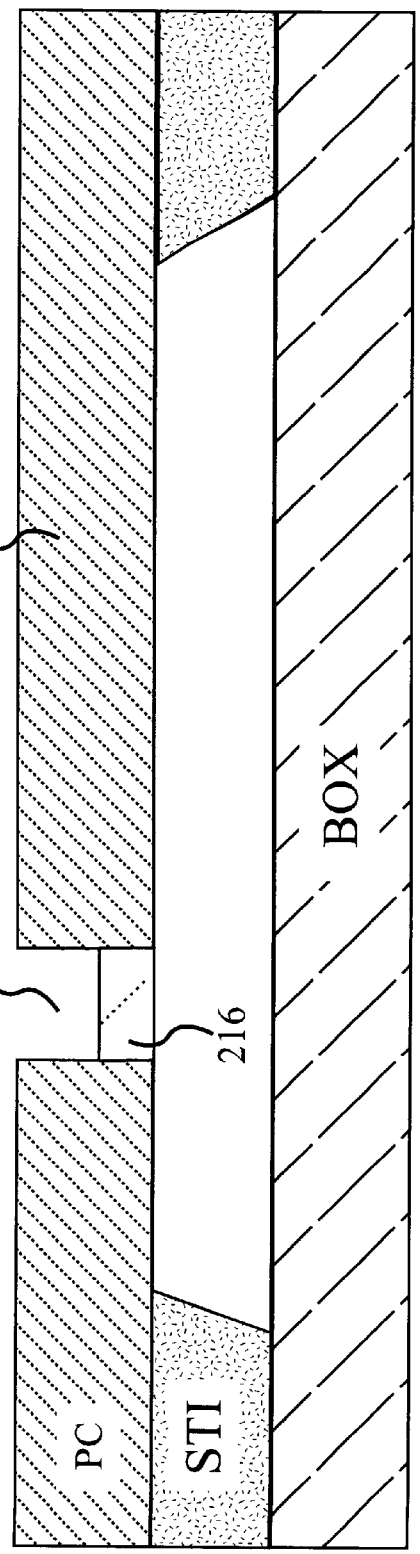
FIG. 10A
FIG. 10B

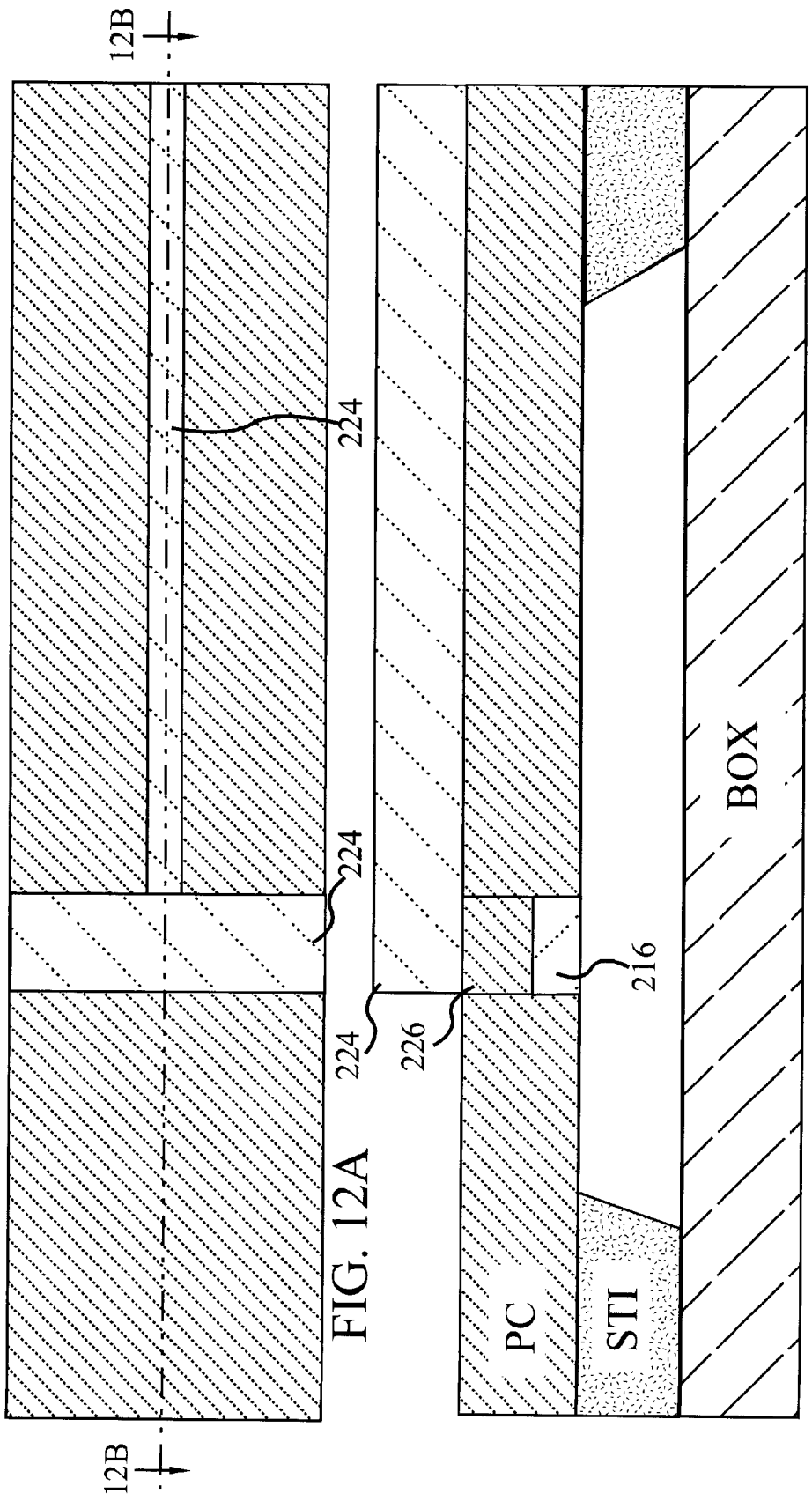

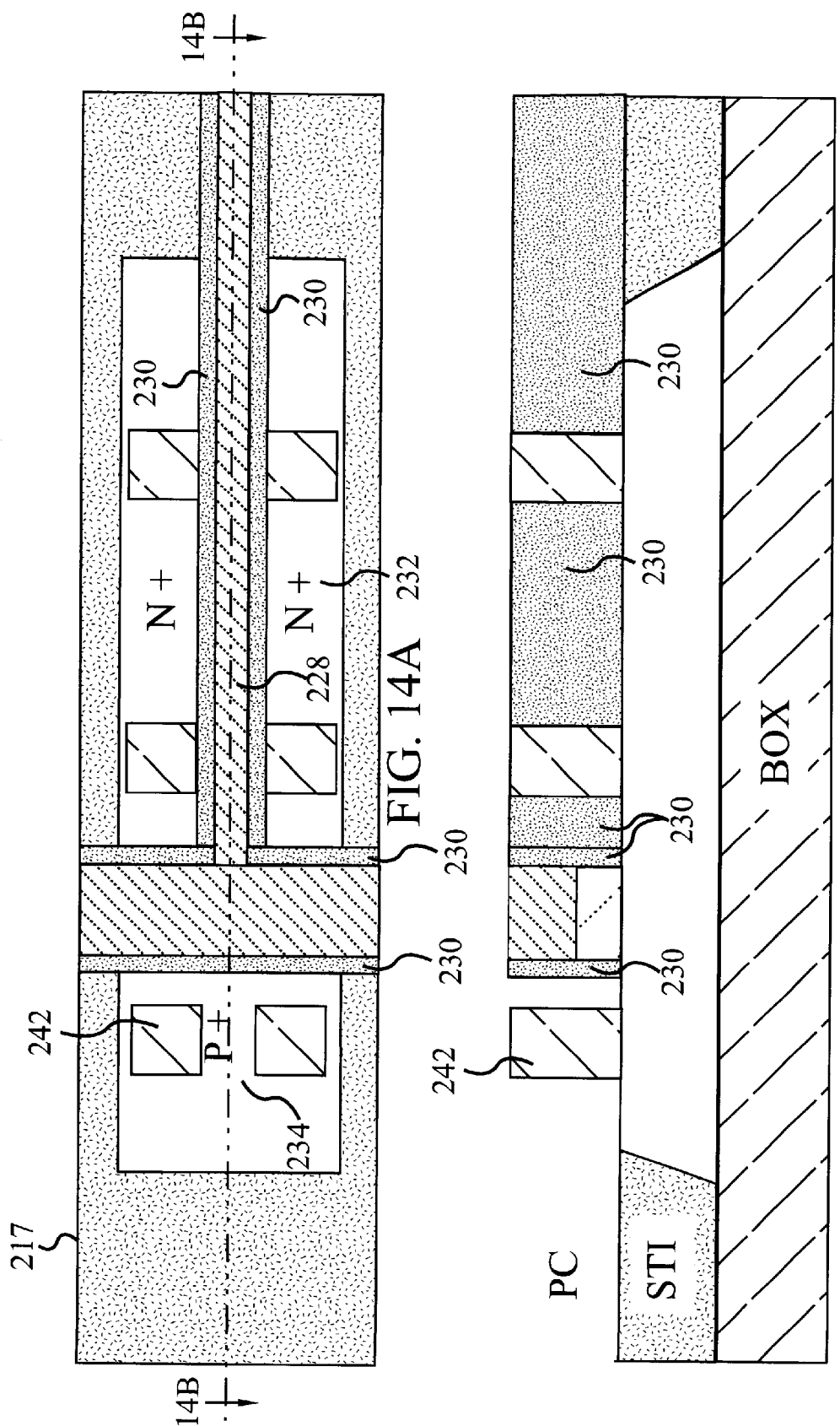

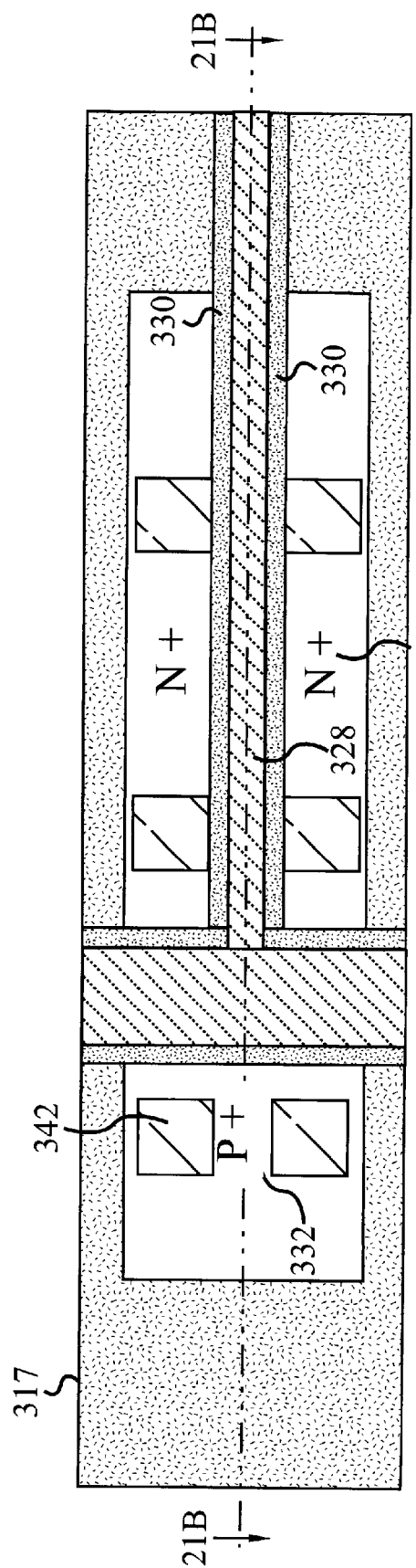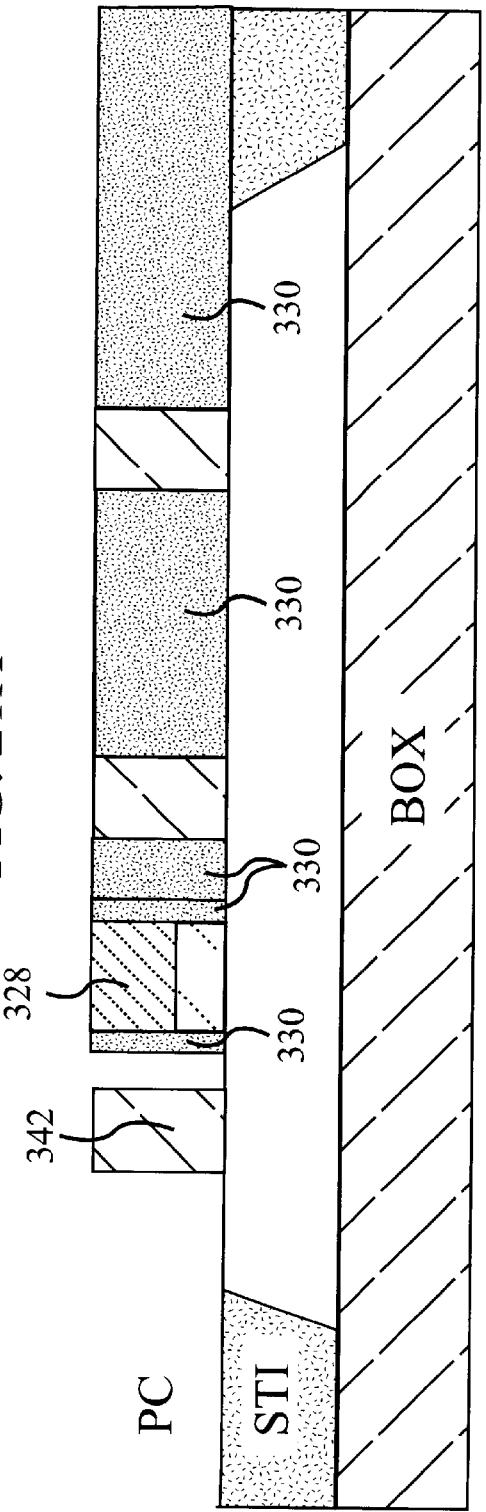
FIG. 21A
FIG. 21B

BODY CONTACT MOSFET

BACKGROUND OF THE INVENTION

1. Technical Field

This invention generally relates to field effect transistors, and more specifically relates to body contact field effect transistors formed in silicon-on-insulator technology.

2. Background Art

A conventional transistor has a source region and a drain region spaced apart by an intervening body region. All of these regions are planar, and are controlled by a gate. The body region is the area from which electron hole pair generation takes place that allows current to be carried between the source and drain regions underneath the gate. By contacting the body region, a charge may be applied that changes the voltage at which the transistor turns on. This is often referred to as a Vt adjustment because the threshold voltage of the device is being adjusted with this technique.

Silicon-on-insulator (SOI) technology employs a layer of semiconductor material overlying an insulation layer on a supporting bulk wafer. Typically, the structure comprises a film of crystalline silicon on a buried layer of silicon oxide on a crystalline silicon substrate. SOI technology makes possible certain performance advantages, such as a reduction in parasitic capacitance, useful in the semiconductor industry.

In a non-SOI transistor the body is automatically contacted simply because it forms part of the same silicon substrate on which all devices sit, and is either grounded via contact to the backside of the chip so the bodies of all the devices are grounded, or tied to the power supply via the N-well. On a SOI wafer, however, the body of the transistor is separated from whatever devices may be separately connected to the wafer by the buried oxide layer. SOI technology where the body is not connected to anything-called a floating body device-may suffer from the problem of hysteresis: the body retains charge and some of the electrical properties from the last time the transistor was used, interfering with subsequent use of the device.

The use of a body contact in SOI addresses this problem, and also presents other opportunities. For example, body contacts allow the threshold voltage to be changed so that standby power can be reduced for low-power applications. Body contacts in SOI have conventionally been made by creating a T-shaped structure on the diffusion, thereby creating three distinct regions: a source, a drain, and a body contact region. This approach leads to decreased performance in that it yields a greatly increased gate capacitance over a conventional device, often leading to very poor performance. Therefore, there exists a need for a body contact in SOI processes that allows precise control of the body potential but that does not lead to the poor performance that comes from high gate capacitance.

SUMMARY OF THE INVENTION

The present invention provides a body contact structure that overcomes the disadvantages of the prior art by utilizing an insulating structure between the body contact portion of the active area and the transistor portion of the active area. In particular, the present invention provides an insulative structure formed across the active area that isolates the portion of the area where transistors are formed from the portions of the active area where the body contact is formed. The body contact produced by these methods adds no significant gate capacitance to the device.

The present invention can be implemented using a variety of fabrication methods. Each fabrication method forms the insulative structure between the transistor portion of the active area and the body contact portion of the active area, but does so in a variety of different ways. One method substitutes an insulator for at least a portion of the gate layer in the regions between the transistor and the body contact. Another method removes a portion of the gate layer and replaces it with an insulative layer in regions between the transistor and the body contact. Still another forms the insulative structure by forming multiple layers, or thicker layers, of gate dielectric between the gate and the body in regions between the transistor and the body contact.

BRIEF DESCRIPTION OF THE DRAWINGS

The foregoing and other features and advantages of the invention will be apparent from the following more particular description of specific embodiments of the invention, as illustrated in the accompanying drawings, wherein:

FIGS. 2–8 are top and cross-sectional side views of an exemplary body contact transistor during fabrication;

FIGS. 10–14 are top and cross-sectional side views of a second exemplary body contact transistor during fabrication;

FIGS. 16–21 are top and cross-sectional side views of a third exemplary body contact transistor during fabrication;

DETAILED DESCRIPTION OF EMBODIMENTS OF THE INVENTION

Figure 1:
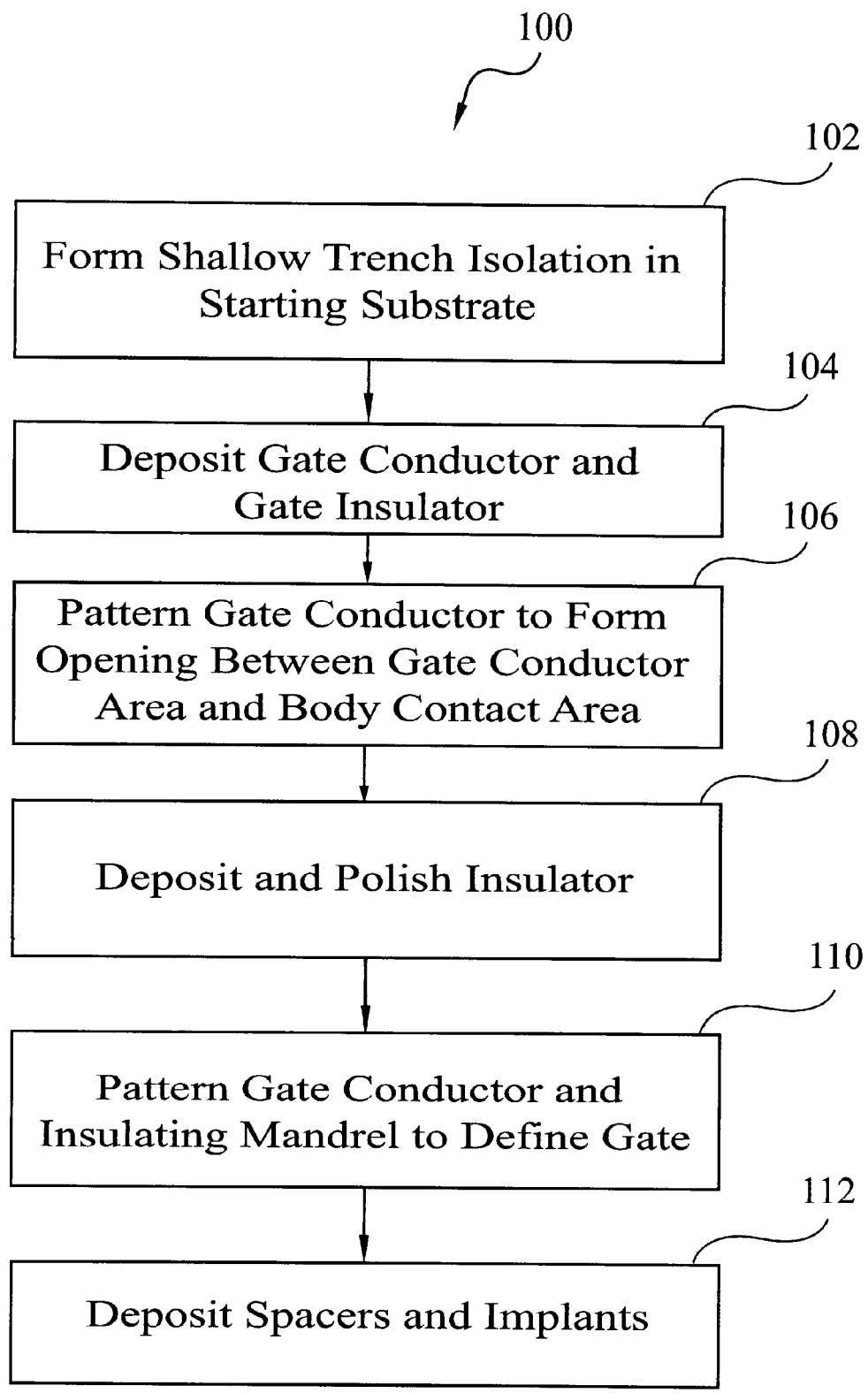
FIG. 1 is a flow diagram illustrating a first fabrication method according to a first embodiment of the present invention.

As has been previously stated, the present invention provides a body contact structure that overcomes the disadvantages of the prior art. The present invention utilizes an insulator structure between the body contact portion of the active area and the transistor portion. In particular, the present invention provides a raised insulative structure, comprising an element distinct from the gate, formed across the active area that isolates the portion of the area where transistors are formed from the portions of the active area where the body contact is formed. The body contact thus produced adds no significant gate capacitance to the gate. The transistor and body contact portions are formed in a substantially coplanar semiconducting substrate.

The present invention can be implemented using a variety of fabrication methods. These methods form the insulative structure between the transistor portion of the active area and the body contact portion of the active area in a variety of different ways. One such method substitutes an insulator for at least a portion of the gate layer in the regions between the transistor and the body contact. Another method forms the insulative structure by forming a thicker layer of gate dielectric between the gate and the body in regions between the transistor and the body contact. Still another removes a portion of the gate layer and replaces it with an insulative layer in regions between the transistor and the body contact.

The non-performing portion of a conventional T-gate is provided for the insulation it offers between the active FET portions of the active area and the body contact area, but is not an active part of the transistor. Instead, it represents a significant amount of area that creates non-functional, non-productive capacitance between the body and the gate. The present invention replaces the non-performmming portion of the T-gate body contact with an insulating portion that does not contribute to parasitic capacitance, thus increasing performance. The semiconducting substrate where the transistors and the body contact are formed is substantially coplanar. Note that the insulating portion of the body contact does not form a part of the gate, but is a distinct element.

A SOI device having no body contact is referred to as a floating body MOSFET device. In some applications, however, there exists a need to contact the body under the NFET and PFET devices, so that the body potential may be accurately controlled. These applications include circuits where it is important that the body voltage be an exact value, and those where matching to other devices is crucial. Specific examples include analog mode sense amplifier circuits and phase locked loops. Additionally, body contacted devices can be useful for low power applications, since the Vt is adjustable.

Conventional body contacts in SOI are made by forming a "T-Body" or "T" gate over the active area and by using the top of the T to isolate the body contact region from the source and drain regions of the device. "H-Body" or "alternative body" contacts are also conventionally used. The existing body contacts, however, share certain shortcomings that dramatically impact performance, among which are the following: they reduce device density; add additional gate capacitance to the MOS device; and increase Rs, or sheet resistance of the gate structure. One of the most significant shortcomings is the increased gate capacitance, which leads to very poor performance when body contacts are called for.

In one embodiment, the present invention makes use of the OP (silicide block) level and the fact that the source/drain implants may be separately defined. Additionally, an embodiment of the invention makes use of the fact that multiple gate oxides may be made available on the same wafer by using the thicker oxide design (DG) level over the body contact region while still using the thinner oxide over the FET channel region for improved performance. The present invention provides a gate, one portion of which is an insulator, and places that insulator such that the source and drain regions are isolated from the body contact region of the device. The body contact thus produced adds no significant gate capacitance to the device.

Referring now to the figures, and in particular to FIG. 1, a method 100 for fabricating a transistor according to one embodiment of the present invention is illustrated. Method 100 forms the insulative structure by substituting an insulator for at least a portion of the gate layer in the regions between the transistor and the body contact. A first step 102 of method 100 is to provide a starting substrate and form a shallow trench isolation therein. In one embodiment, the starting substrate comprises a silicon-on-insulator (SOI) wafer, which in turn comprises a buried oxide (BOX) layer beneath an SOI layer. However, non-SOI wafers can also be used. When a non-SOI wafer is used, the processing remains identical to that of the SOI wafer case, except as noted.

Figure 2A:
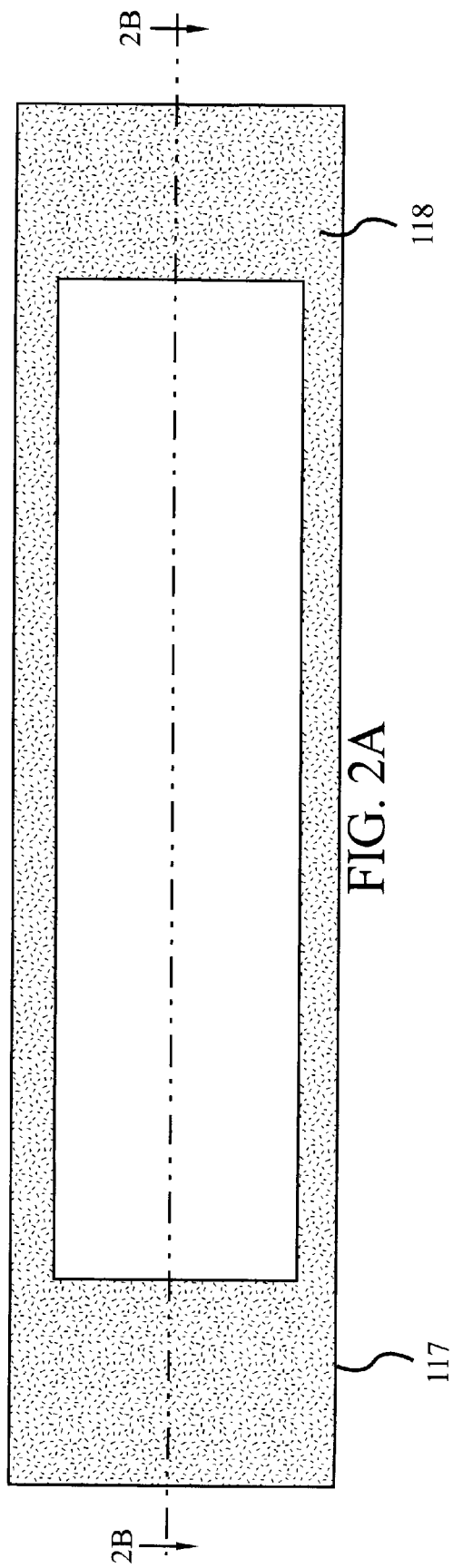
Figure 2B:
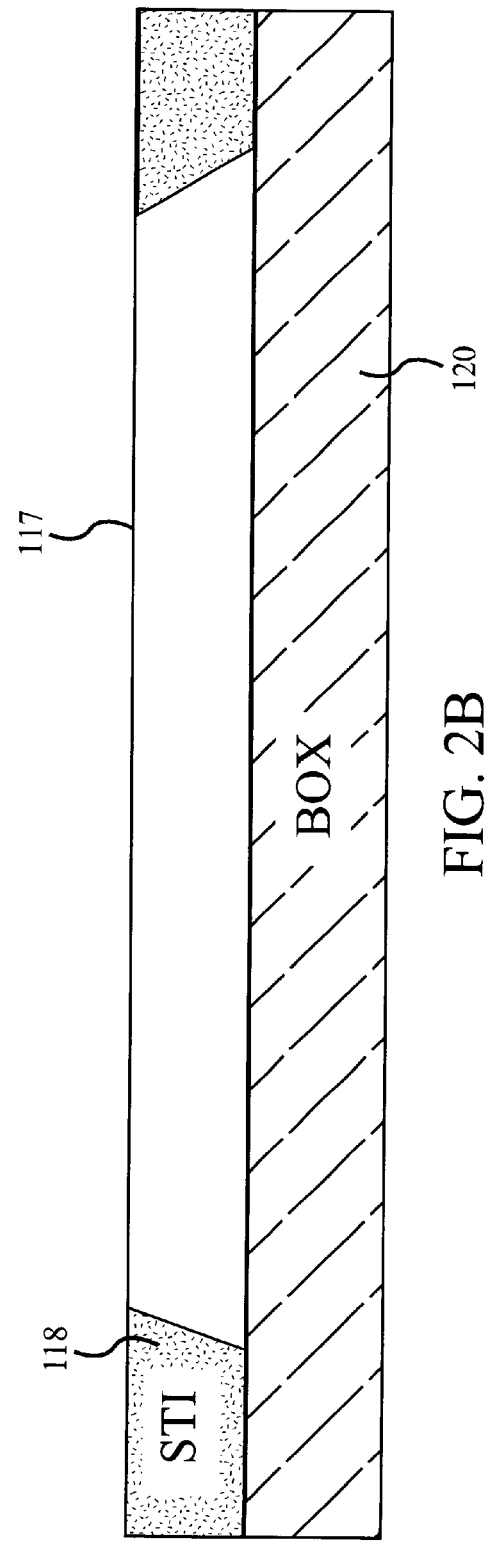

Referring now to FIGS. 2A and 2B, the starting substrate comprises an active area 117 that has been provided with a shallow trench isolation layer 118. Isolation layer 118 overlies a BOX layer 120. FIG. 2A illustrates a top view of the active area 117, and FIG. 2B illustrates a cross-sectional side view taken at line 2B of FIG. 2A. In each of FIGS. 2–8, 10–14, and 16–21, the figure labeled "A" represents a top view of the active area and the figure labeled "B" represents a cross sectional view taken along the line shown in the figure labeled "A." After shallow trench isolation layer 118 is formed, a gate dielectric layer, not shown, is formed in a conventional manner and deposited over active area 117.

Returning to FIG. 1, a second step 104 of method 100 is to deposit a gate conductor layer over the substrate. The gate conductor layer may comprise polysilicon, or any other suitable conductive layer.

Figure 3A:
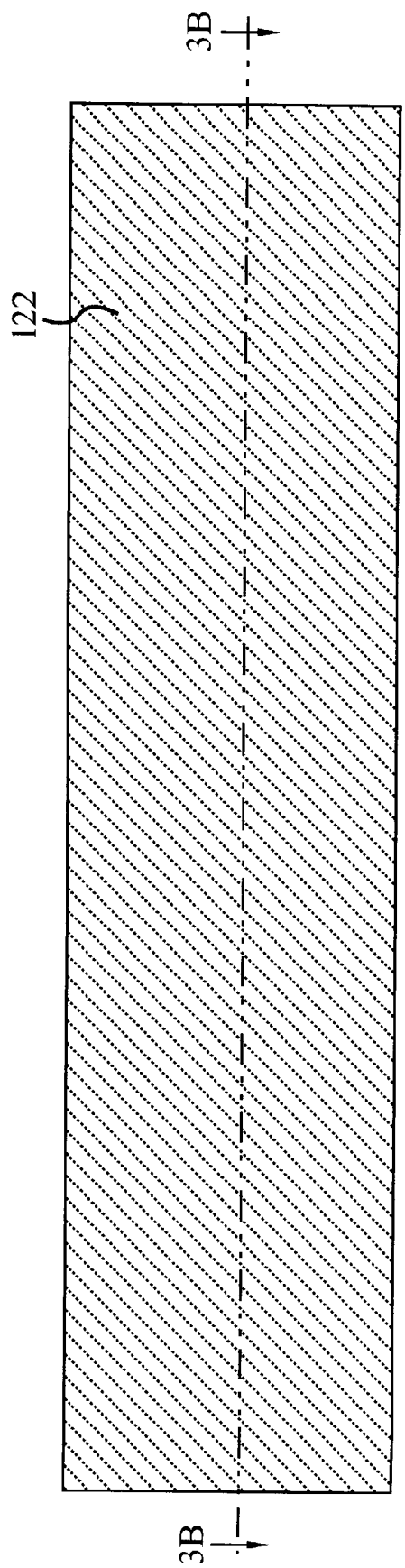
Figure 3B:
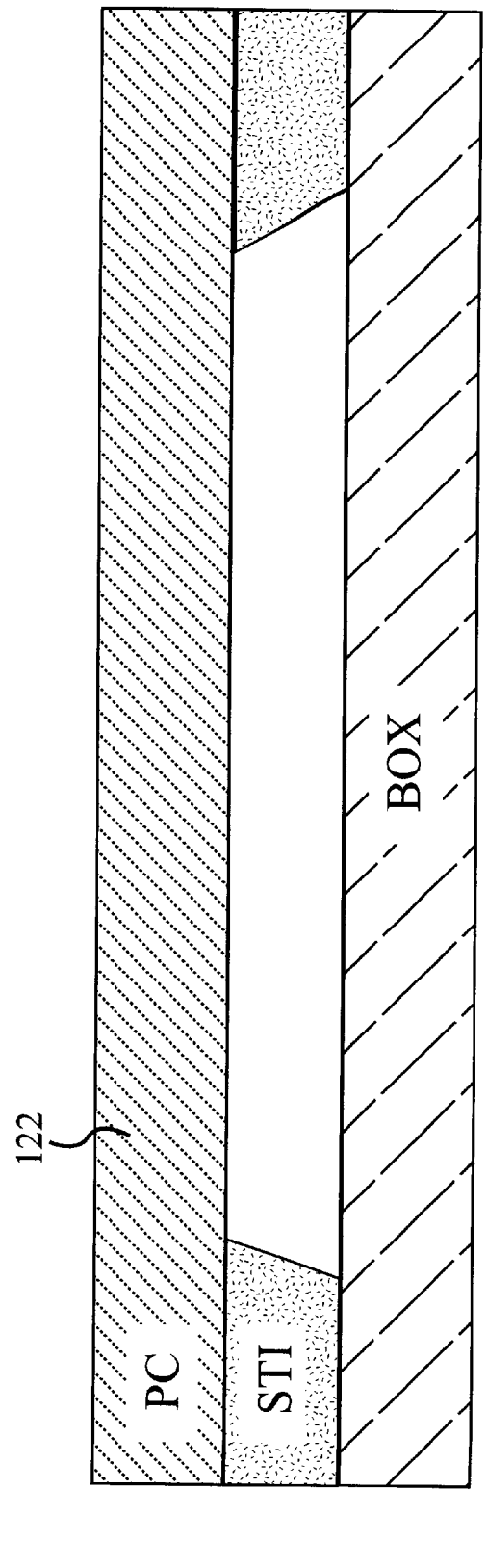

In FIGS. 3A and 3B, a polysilicon layer 122 has been deposited over shallow trench isolation layer 118. Polysilicon layer 122 forms the gate of the transistor in the pictured embodiment, but other materials may also be used as the gate material.

Figure 4A:
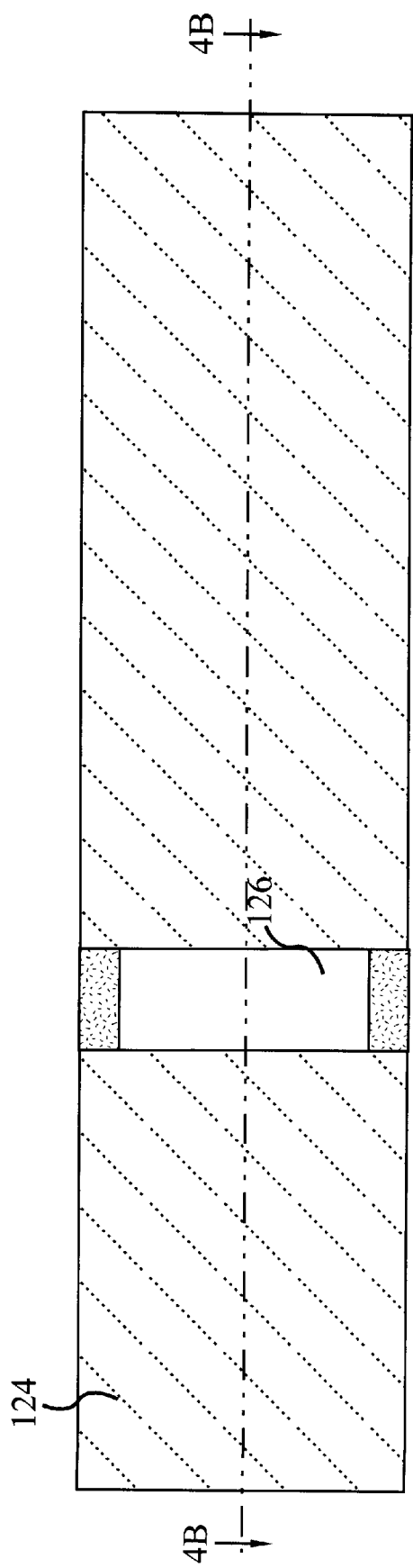
Figure 4B:
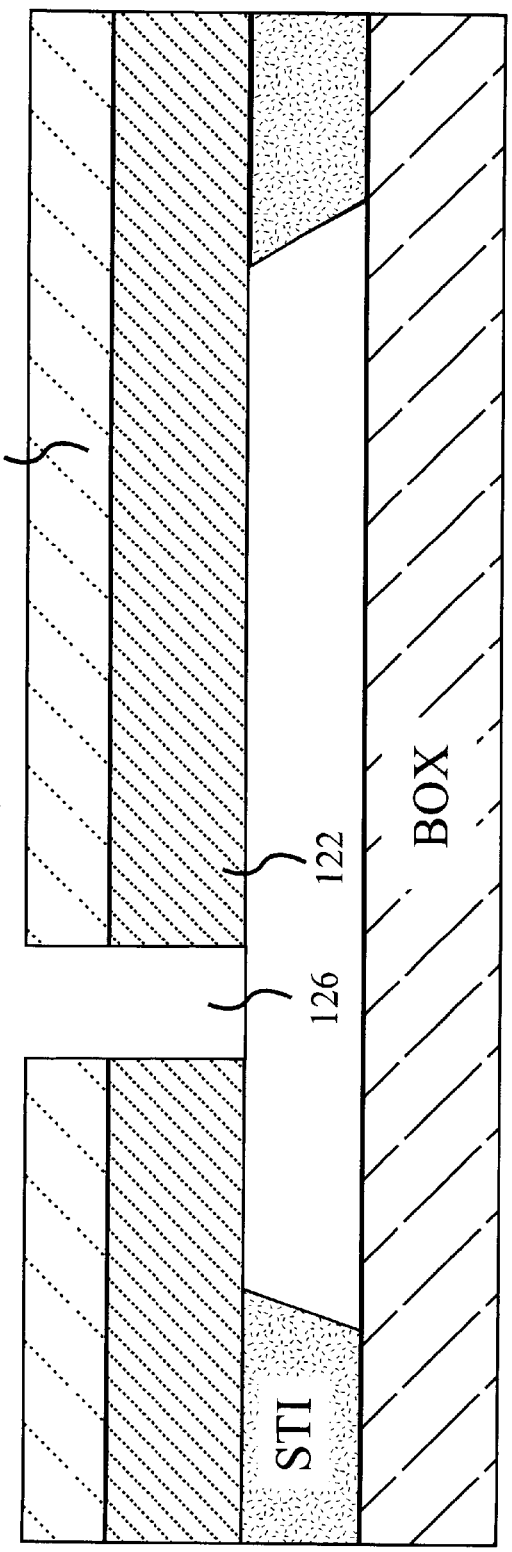

Returning to FIG. 1, a third step 106 of method 100 is to pattern the gate conductor to form an opening between the gate conductor area and the body contact area. Through this opening, an insulator will be installed, as will be further described below, in order to accomplish the goal of reducing parasitic capacitance. One method of forming this opening is to apply a first gate mask over the gate material and etch away the gate material left unprotected by the mask. One of ordinary skill in the art will appreciate that other methods may also be used. In FIGS. 4A and 4B, a first gate mask 124 is formed over polysilicon layer 122. Mask 124 is continuous everywhere except at a gap 126, the function of which will be explained below. Mask 124 may be formed from any suitable material, such as silicon nitride or photo resist. Mask 124 would typically be patterned using photoresist and then used to pattern the underlying polysilicon layer 122. Mask 124 is adapted to protect polysilicon layer 122 from the etching process that removes all polysilicon not so protected.

Figure 5A:
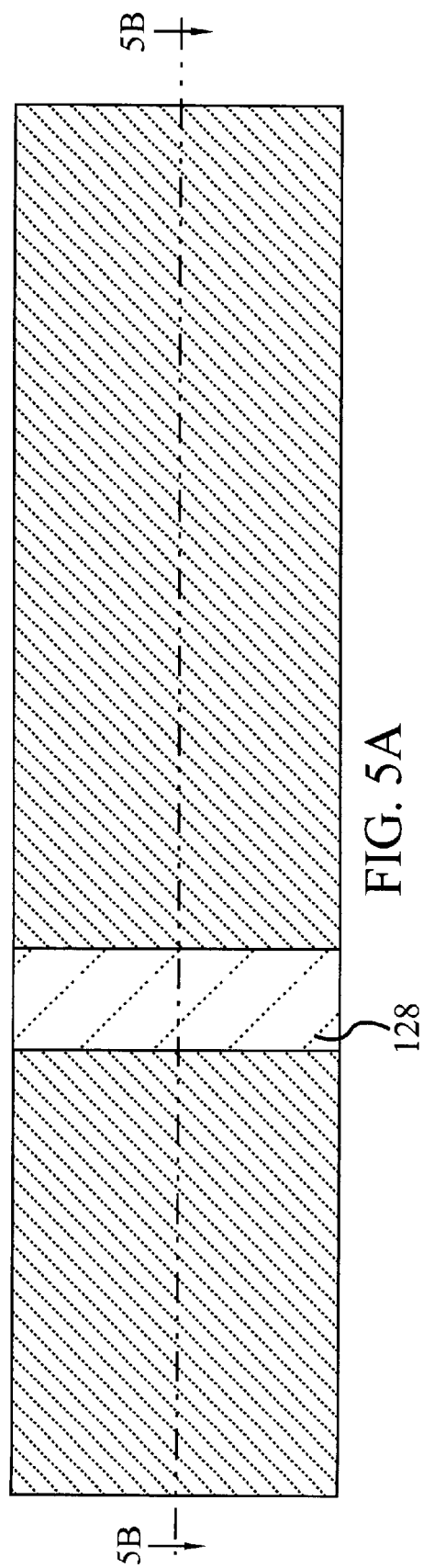
Figure 5B:
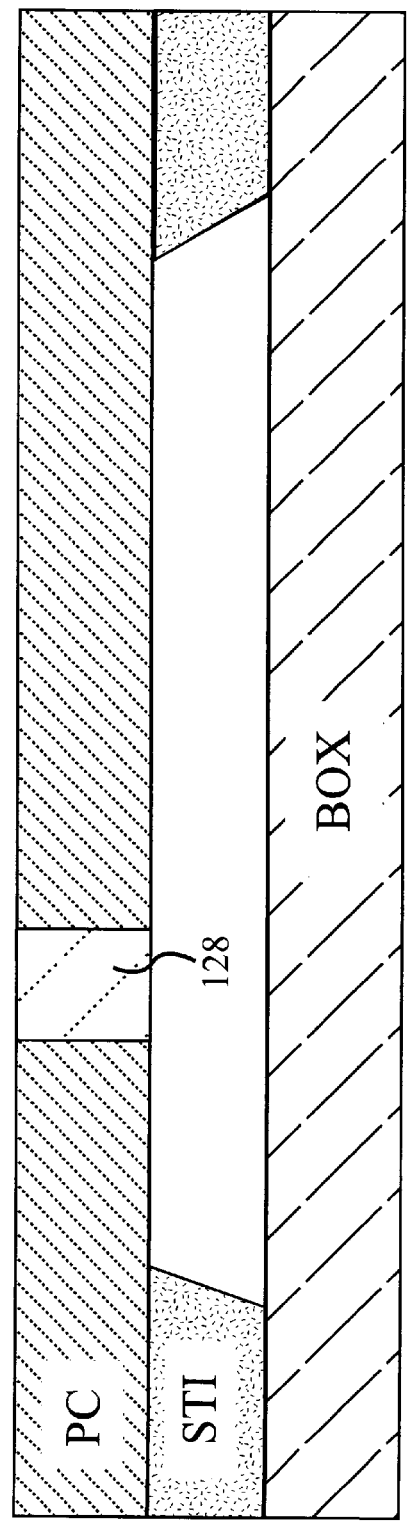

Referring again to FIG. 1, a fourth step 108 of method 100 is to deposit and polish an insulating material in the gap left in the polysilicon by the etching process. FIGS. 5A and 5B show an insulator 128 placed in gap 126 of FIGS. 4A and 4B. Insulator 128, which may be an oxide material, separates the body contact from the source/drain region.

Returning to FIG. 1, a fifth step 110 of method 100 is shown to be the second patterning of the gate conductor. One method of doing this is to apply a second gate mask over the gate material, and then etch the unprotected material away. FIGS. 6A and 6B show a second gate mask 130 placed over polysilicon layer 122. In the case where an oxide is used as the material for insulator 128, mask 130 is selective to oxide so that when the gate is patterned, the insulator will remain in place rather than getting etched out. FIGS. 7A and 7B show the condition of active area 117 after the etching process has been completed. Note that second mask 130 has been removed in FIGS. 7A and 7B, and that a strip 132 of polysilicon layer 122 remains on active area 117. Also remaining is insulator 128. Together, insulator 128 and polysilicon strip 132 form a T-shaped body 134, when seen in the top view of FIG. 7A.

Returning now to FIG. 1, a sixth step 112 of method 100 is to deposit spacers and implants onto active area 117. This is depicted in FIGS. 8A and 8B, where sidewall spacers 136 surround insulator 128 and polysilicon strip 132. Sidewall spacers 136 separate the edge of the conductive gate material from the source/drain implants. Source/drain implants 138 are placed near polysilicon strip 132, while body contact implants 140 are placed near insulator 128. Interconnects 142 serve as connections to the body contact area, and may be formed in any conventional manner.

Figure 9:
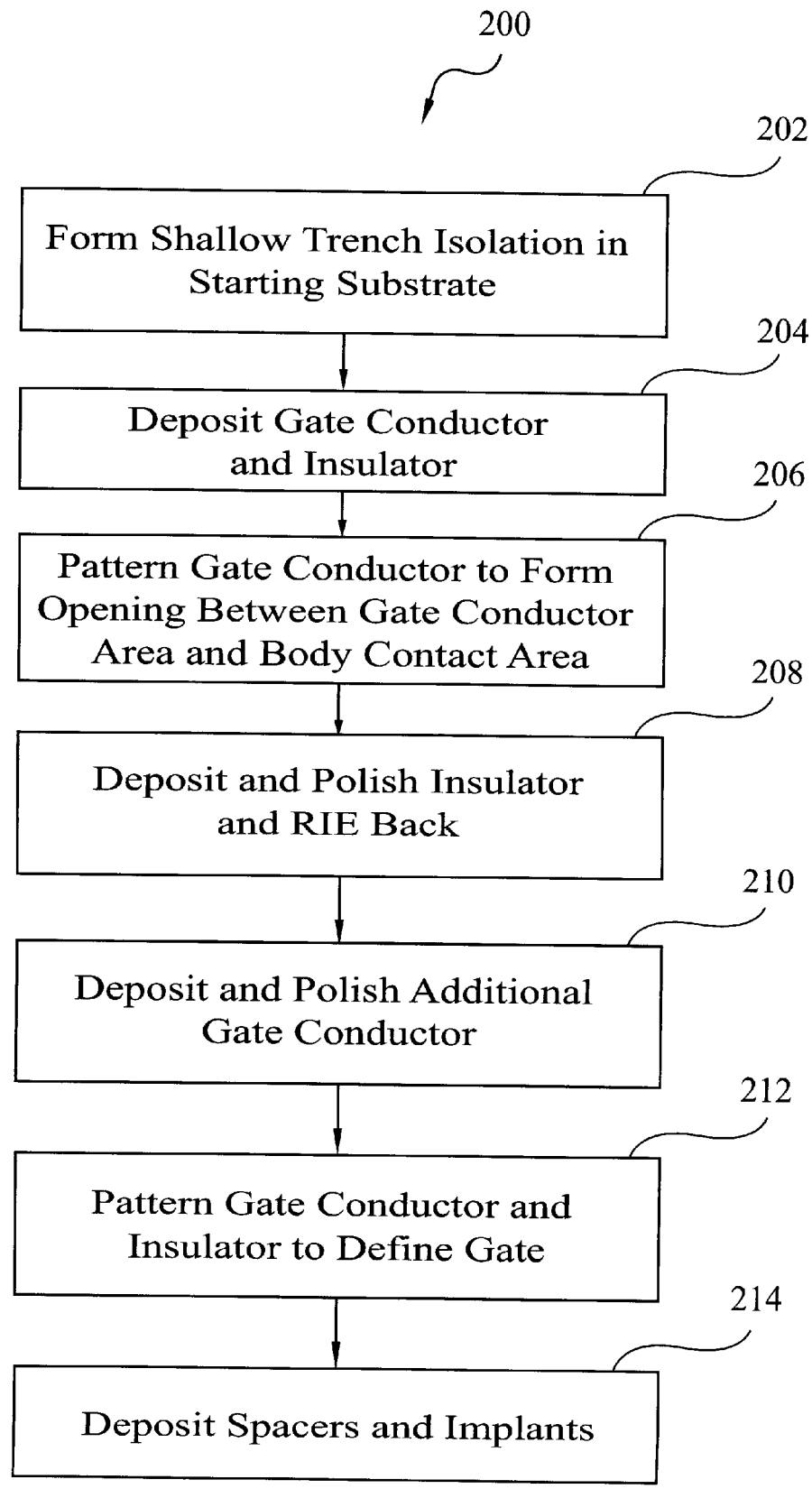
FIG. 9 is a flow diagram illustrating a second fabrication method according to the embodiment of the preceding figures.

Referring now to FIG. 9, a second method 200 for fabricating a transistor according to an embodiment of the present invention is illustrated. Method 200 offers an alternate way to form the insulative structure by substituting an insulator for at least a portion of the gate layer in the regions between the transistor and the body contact. In a first step 202 of method 200, a shallow trench isolation is formed in a starting substrate. A second step 204 is to deposit a gate conductor, and a third step 206 is to pattern the gate conductor. These first three steps 202 through 206 are thus the same as the first three steps 102 through 106 in method 100 illustrated in FIG. 1. A fourth step 208 is to deposit and polish an insulator and then etch it back a little so it's not as thick as it was in method 100. This is depicted in FIGS. 10A and 10B, where an insulator 216 has been deposited on an active area 217 over a polysilicon layer 218. As seen in FIG. 10B, insulator 216 has been etched back such that a slot 220 is created in polysilicon layer 218.

Figure 11A:
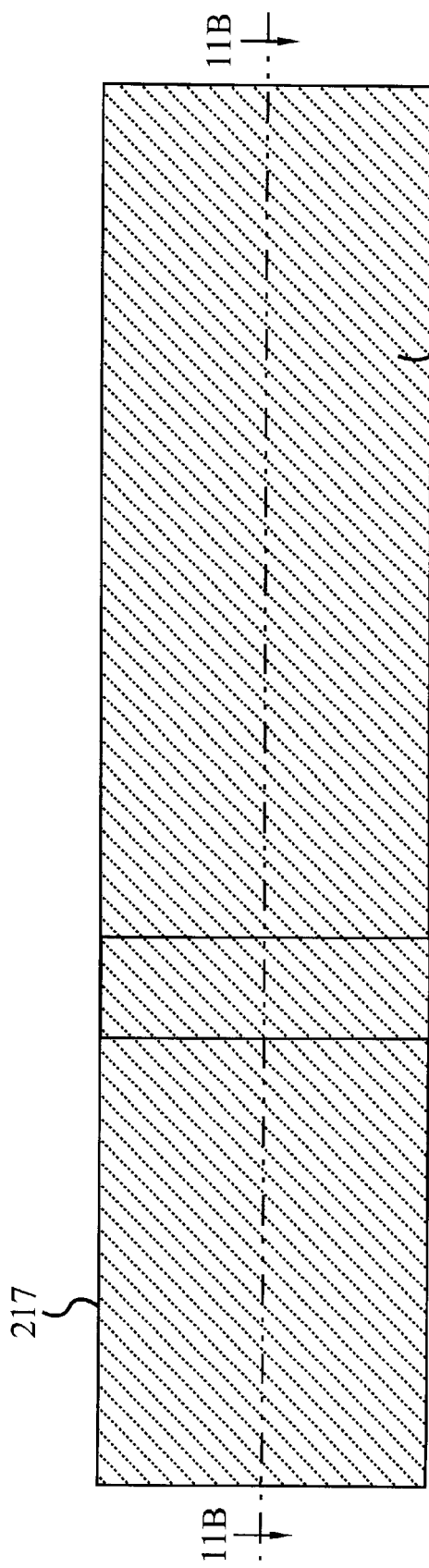
Figure 11B:
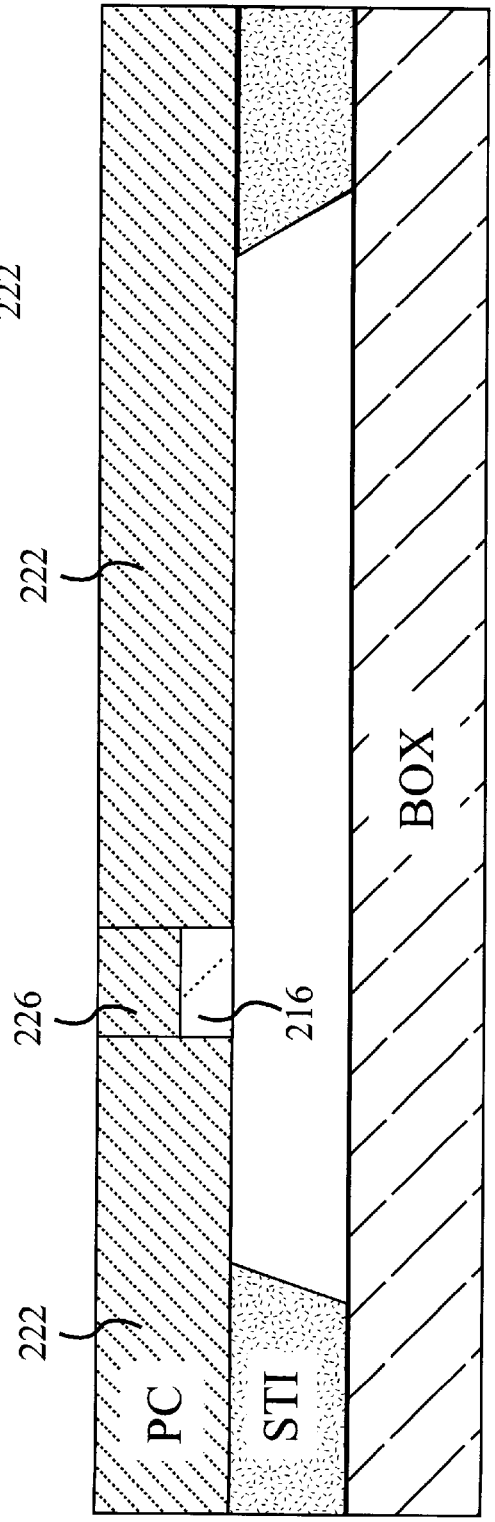

Returning to FIG. 9, a fifth step 210 of method 200 is to deposit another layer of gate conductor and polish it flat with the top surface of the gate. FIGS. 11A and 11B show a second layer of polysilicon 222 overlying substantially all of active area 217, including insulator 216. Slot 220, shown in FIG. 10B, has also been filled with polysilicon 222. The portion of polysilicon layer 222 that fills slot 220 will be referred to herein as a plug 226.

Figure 13A:
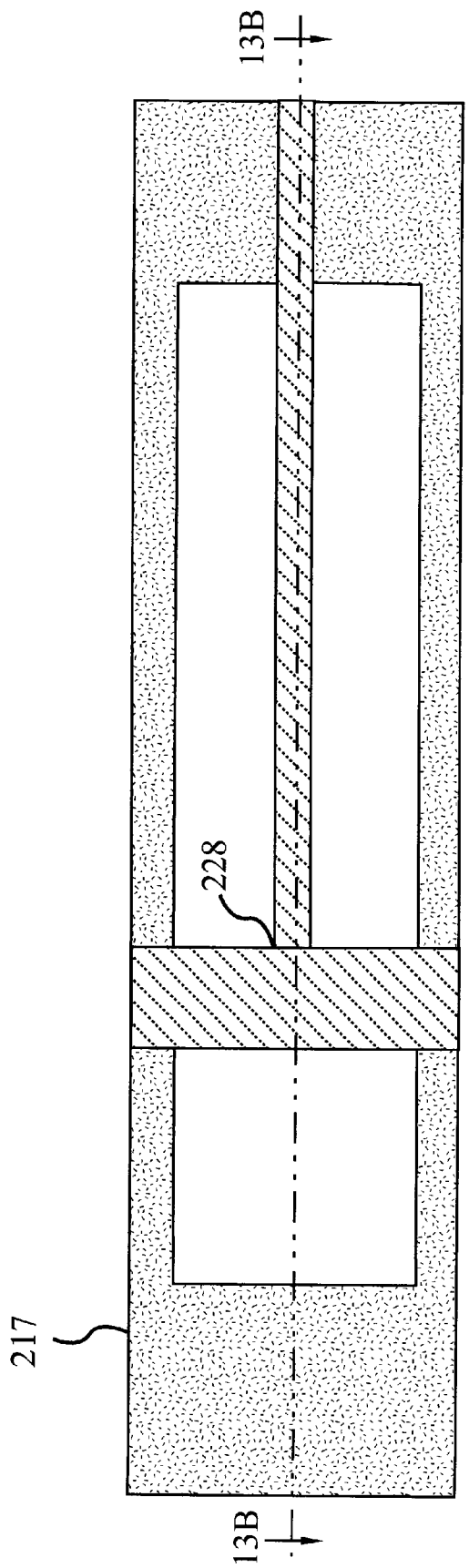
Figure 13B:
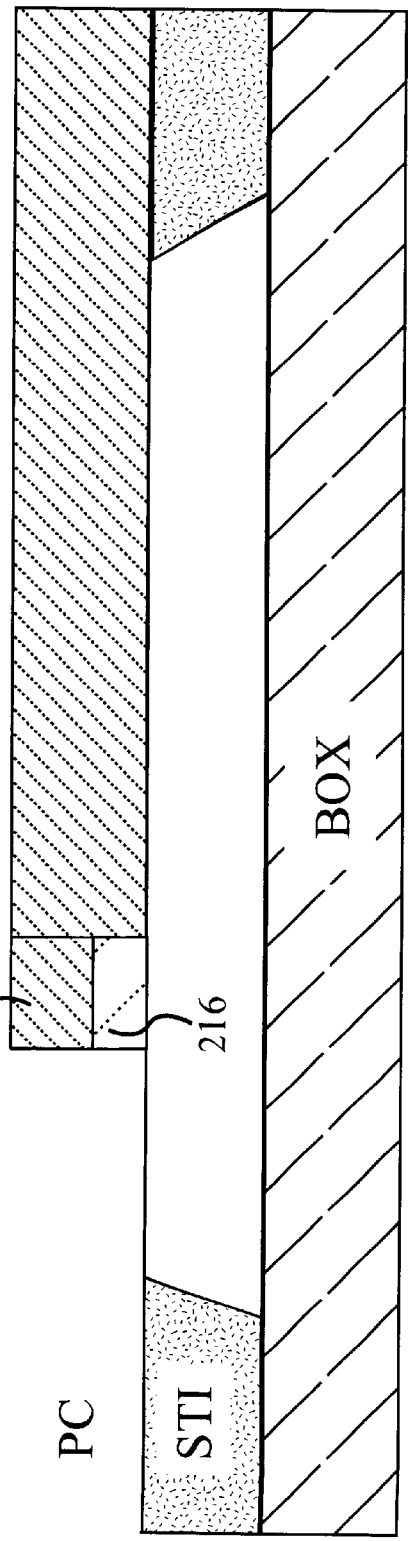

A sixth step 212 of method 200, as shown in FIG. 9, is to again pattern the gate conductor, which may be accomplished by applying a second gate mask and etching the polysilicon a second time. One example of this step is shown in FIGS. 12A and 12B. A second gate mask 224, which may have a "T" shape as shown, is placed over that portion of the polysilicon which is to remain after the etching process is complete. As discussed in connection with FIG. 10B, plug 226 of polysilicon has been placed over insulator 216, and plug 226 would conventionally be covered by mask 224 or it will be etched away, exposing insulator 216. FIGS. 13A and 13B shows the appearance of active area 217 after the etching process is complete. Note that a T-shaped gate 228 has been created on the substrate, and that insulator 216 remains covered by polysilicon plug 226.

Returning to FIG. 9, a seventh step 214 of method 200 is to deposit spacers and implants on active area 217. FIGS. 14A and 14B depict this step in more detail. Specifically, sidewall spacers 230 surround T-shaped gate 228 and prevent the source/drain implants 232 and body contact implants 234 from making contact with the edge of the conductive gate material. Interconnects 242 serve as connections to the body contact area, and may be formed in any conventional manner.

Figure 15:
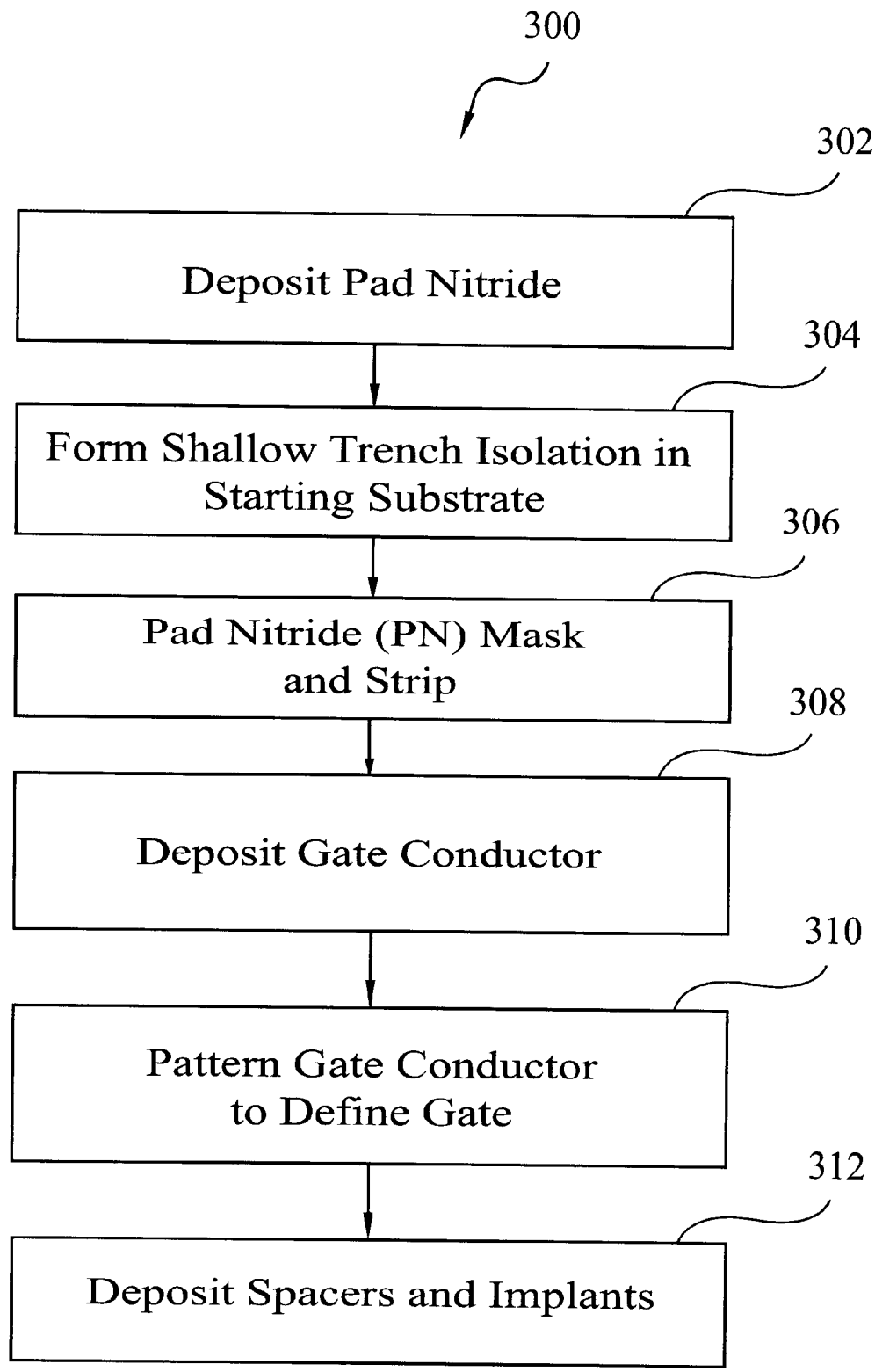
FIG. 15 is a flow diagram illustrating a third fabrication method according to the embodiment of the preceding figures.
Figure 16A:
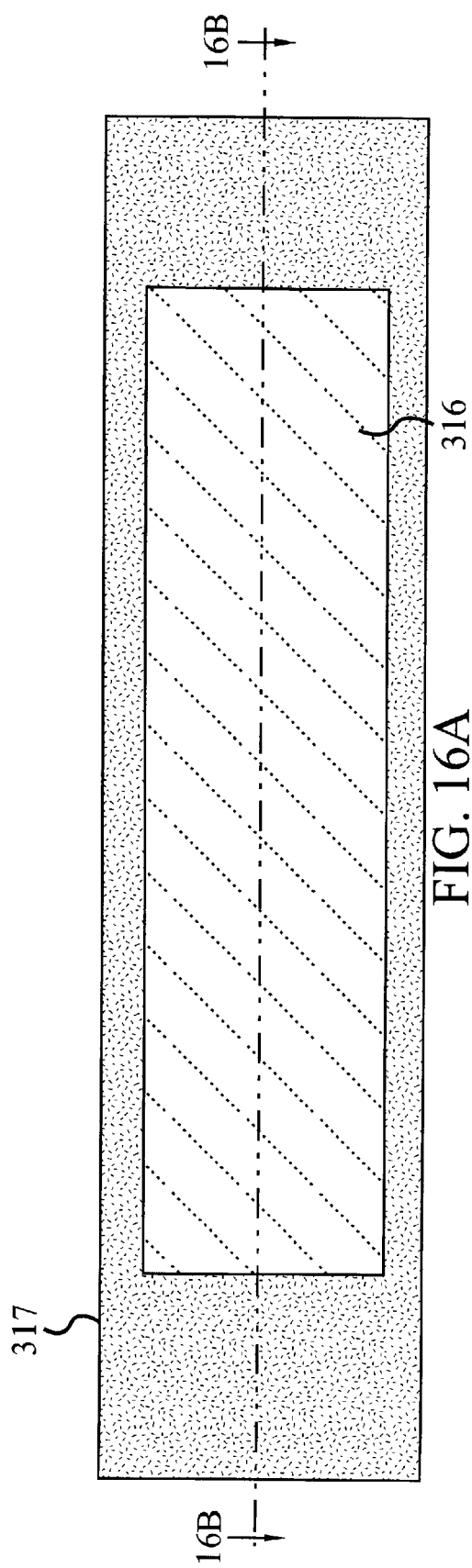
Figure 16B:
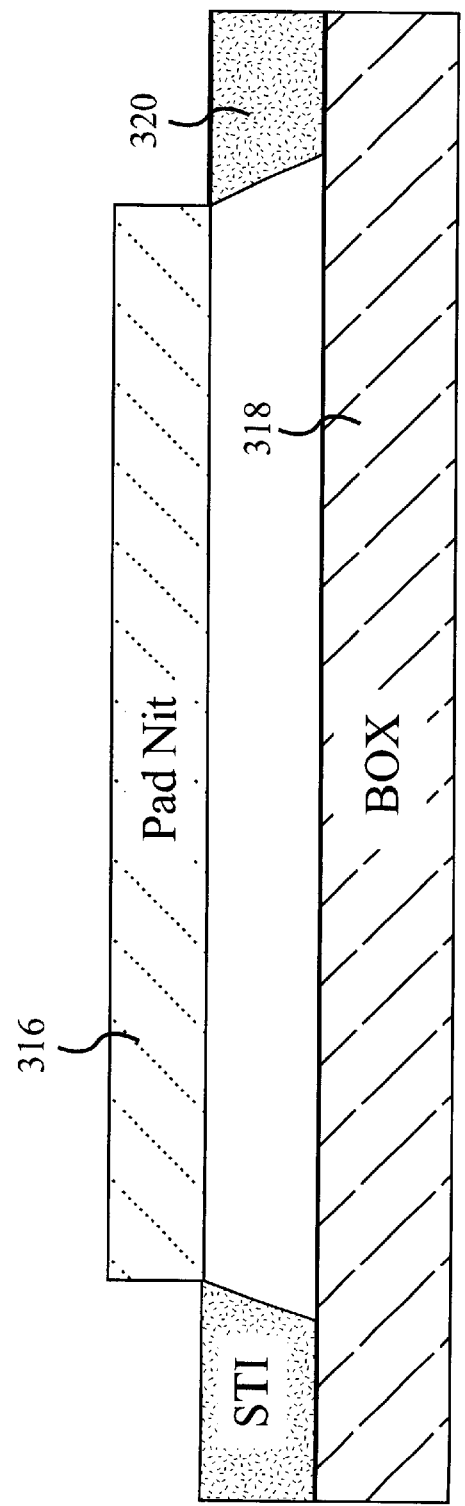

Referring now to FIG. 15, a third method 300 for fabricating a transistor according to the present invention is illustrated. Method 300 is yet another way to form the insulative structure by substituting an insulator for at least a portion of the gate layer in the regions between the transistor and the body contact. Method 300 shares some steps with methods 200 and 100, but also includes certain steps that are not part of methods 200 and 100, as will be illustrated below. A first step 302 of method 300 is to deposit pad nitride over silicon on a wafer. A second step 304 is to form a shallow trench isolation (STI) in the substrate. FIGS. 16A and 16B depict an active area 317 on which a pad nitride layer 316 is formed. Pad nitride layer 316 protects the SOI regions embodied here as a BOX layer 318. FIGS. 16A and 16B depict active area 317 after pad nitride layer 316 has been deposited and an STI trench 320 has been formed and polished.

Figure 17A:
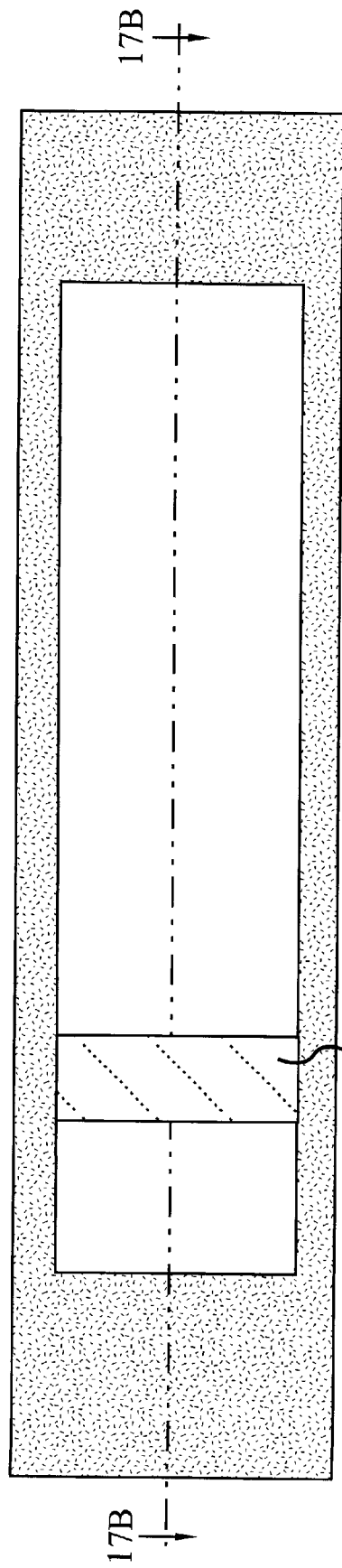
Figure 17B:
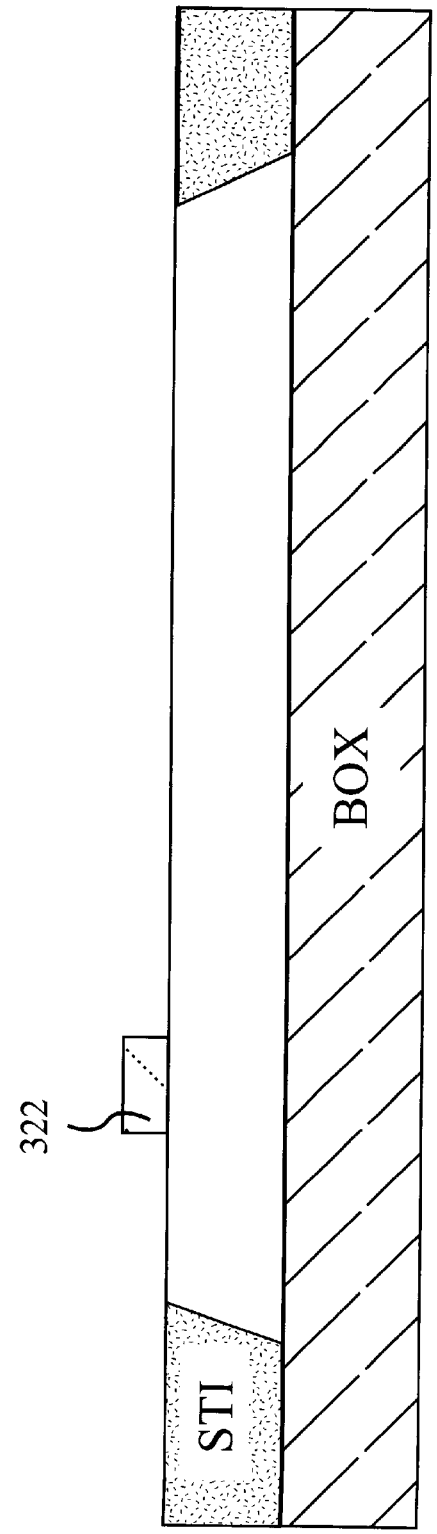
Figure 18A:
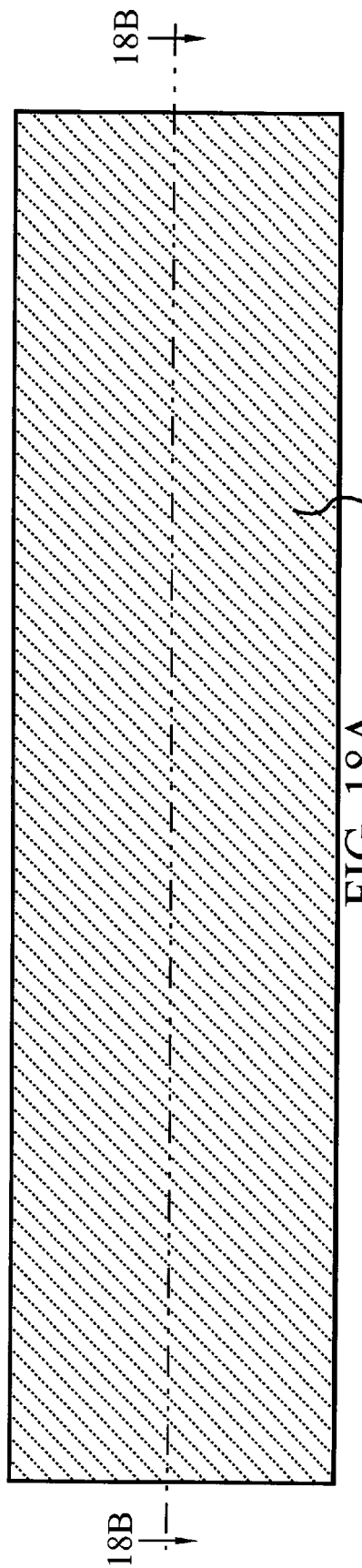
Figure 18B:
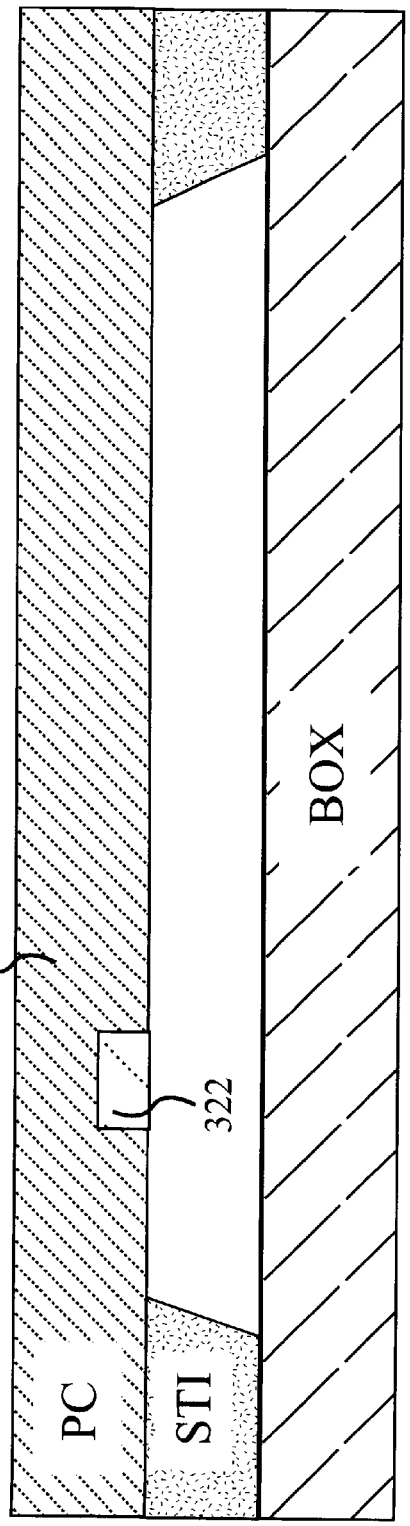

Returning to FIG. 15, a third step 306 is to form a mask over the pad nitride layer and strip away all the pad nitride not protected by that mask. FIGS. 17A and 17B show a pad nitride region 322 left behind after the stripping process.

Again referring to FIG. 15, a fourth step 308 of method 300 is to deposit a gate conductor. If desired, the gate conductor may also be polished flat with the top surface of the gate, though this step is optional. This step is shown in more detail in FIGS. 18A and 18B, where pad nitride region 322 has been covered by a polysilicon layer 324.

Figures 19A, 19B:
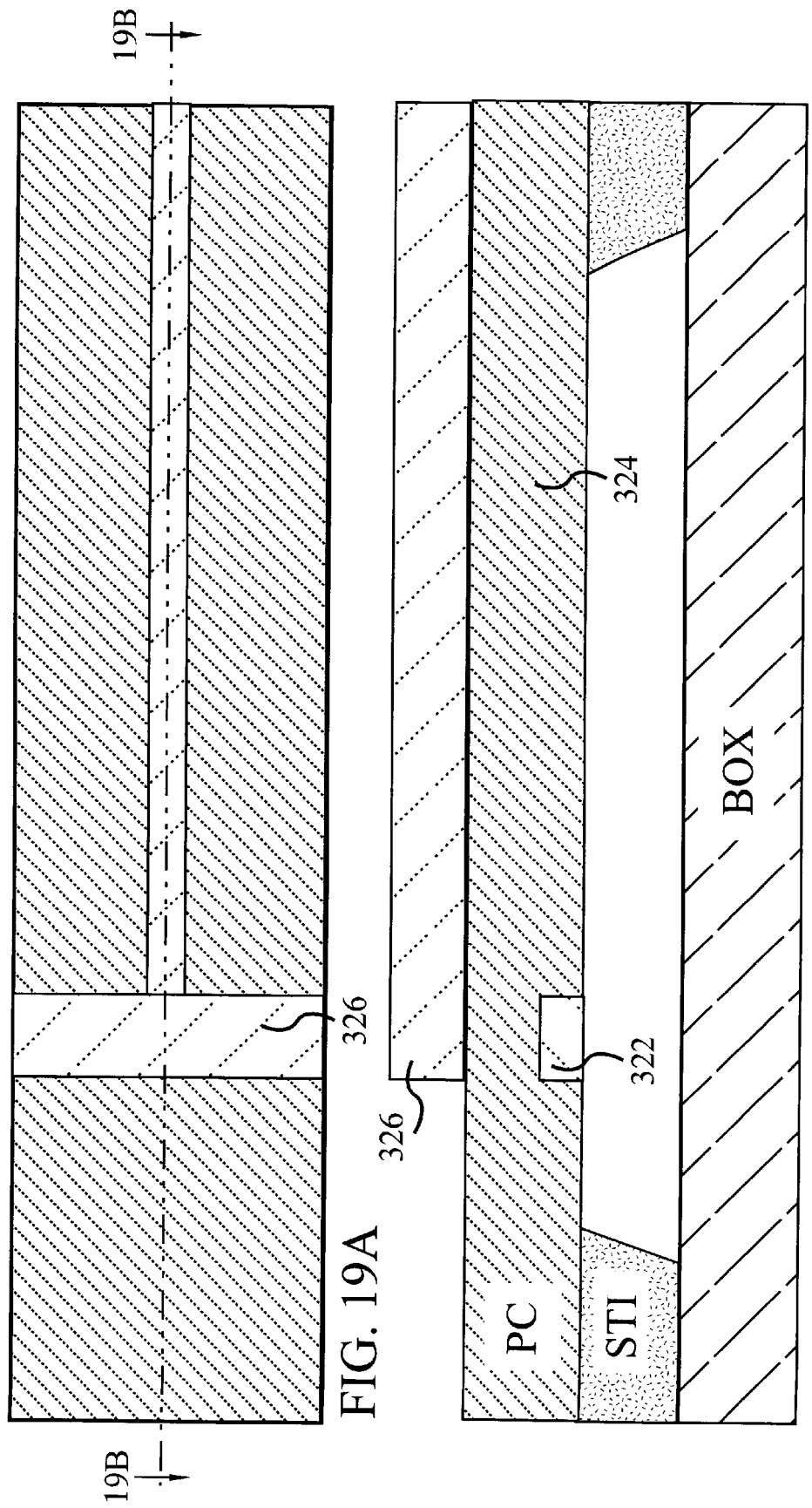
Figure 20A:
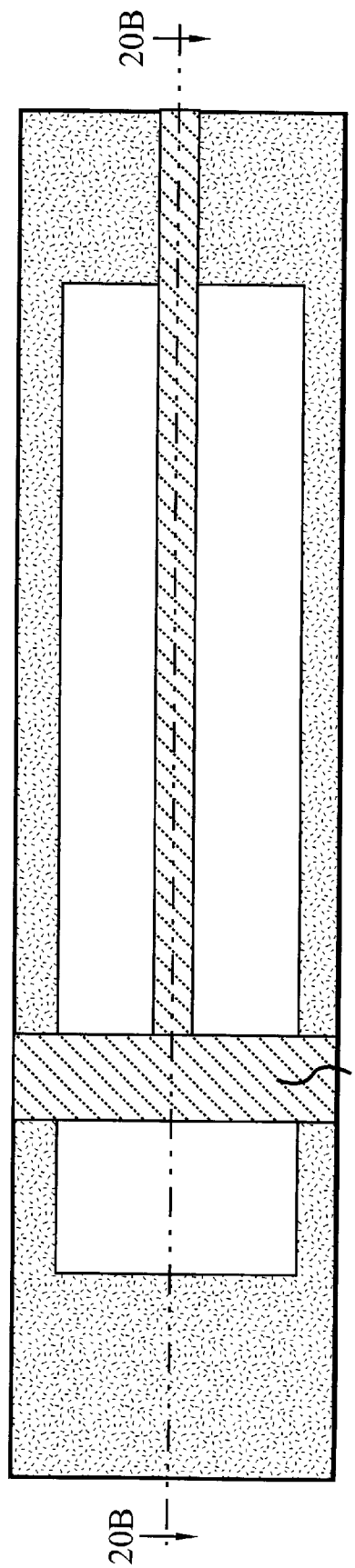
Figure 20B:
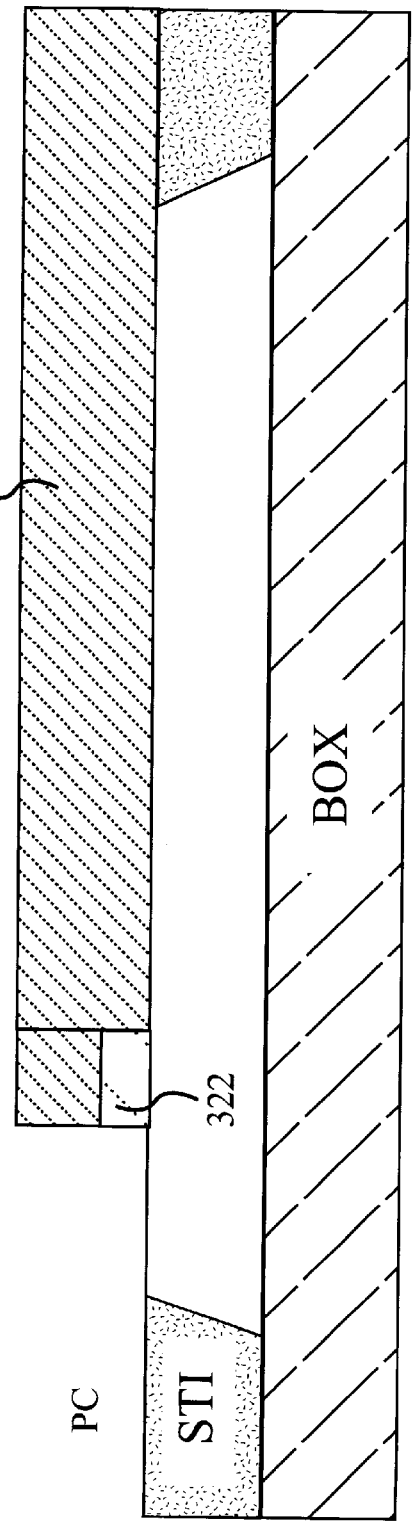

Referring again to FIG. 15, a fifth step 310 of method 300 is to pattern the gate conductor. As was described in connection with FIGS. 1 and 9, one method of doing this is to apply a gate mask and etch the gate material. Referring to FIGS. 19A and 19B, a gate mask 326 has been applied over gate material 324. Note that gate mask 326 has the form of a "T," although, as has been explained, other shapes and forms are also possible. FIGS. 20A and 20B depict active area 317 after the gate material has been etched away. A gate 328 remains on active area 317, part of which covers pad nitride region 322.

Returning once more to FIG. 15, a sixth step 312 of method 300 is to deposit spacers and implants on active area 317. FIGS. 21A and 21B show active area 317 after this has been done. Specifically, sidewall spacers 330 surround gate 328, and a body contact region 332 and a source/drain region 334 have been added near gate 328. Interconnects 342 serve as connections to the body contact area, and, as before, may be formed in any conventional manner.

Figure 22:
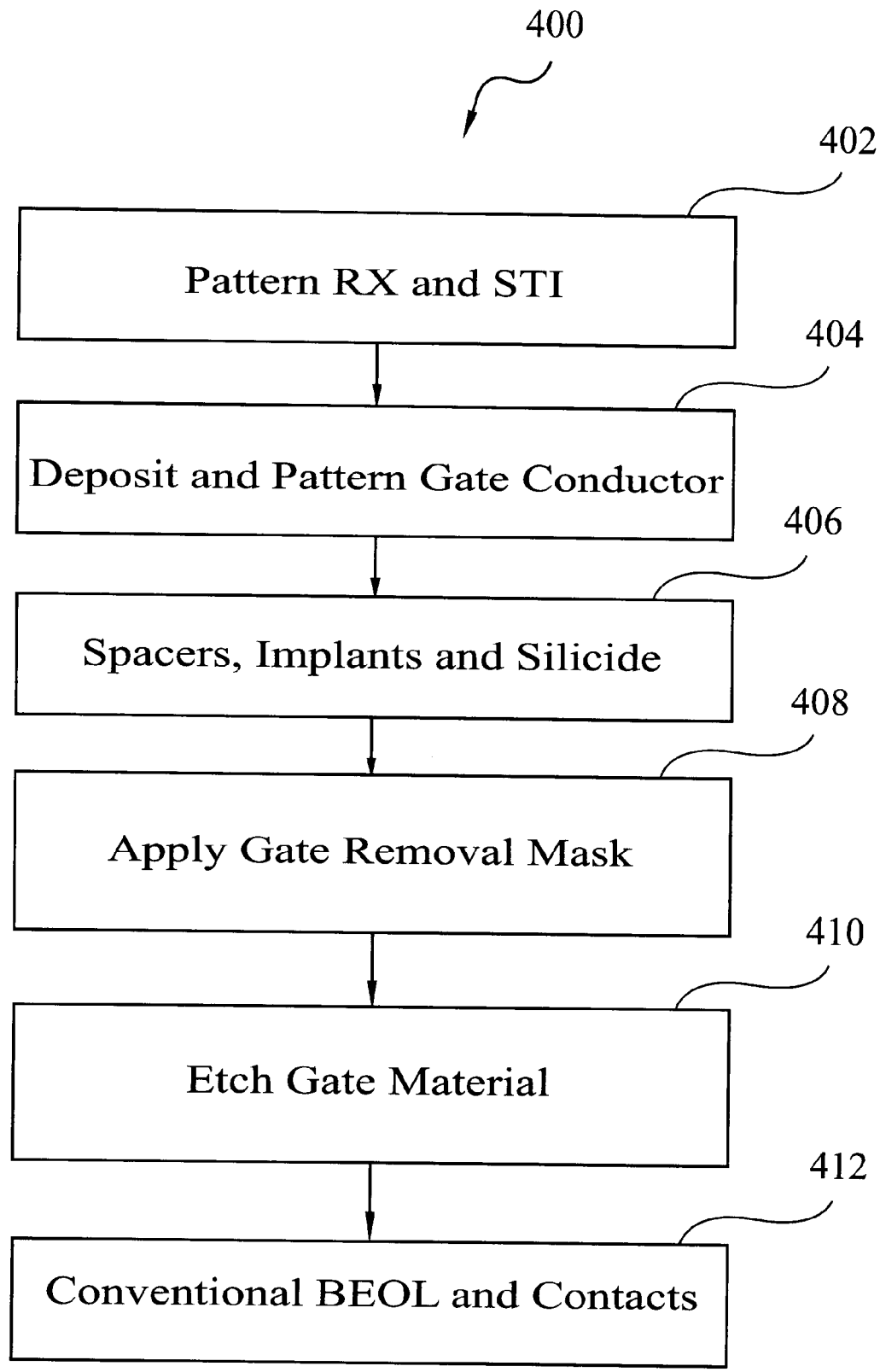
FIG. 22 is a flow diagram illustrating a fabrication method according to a second embodiment of the present invention.
Figure 23:
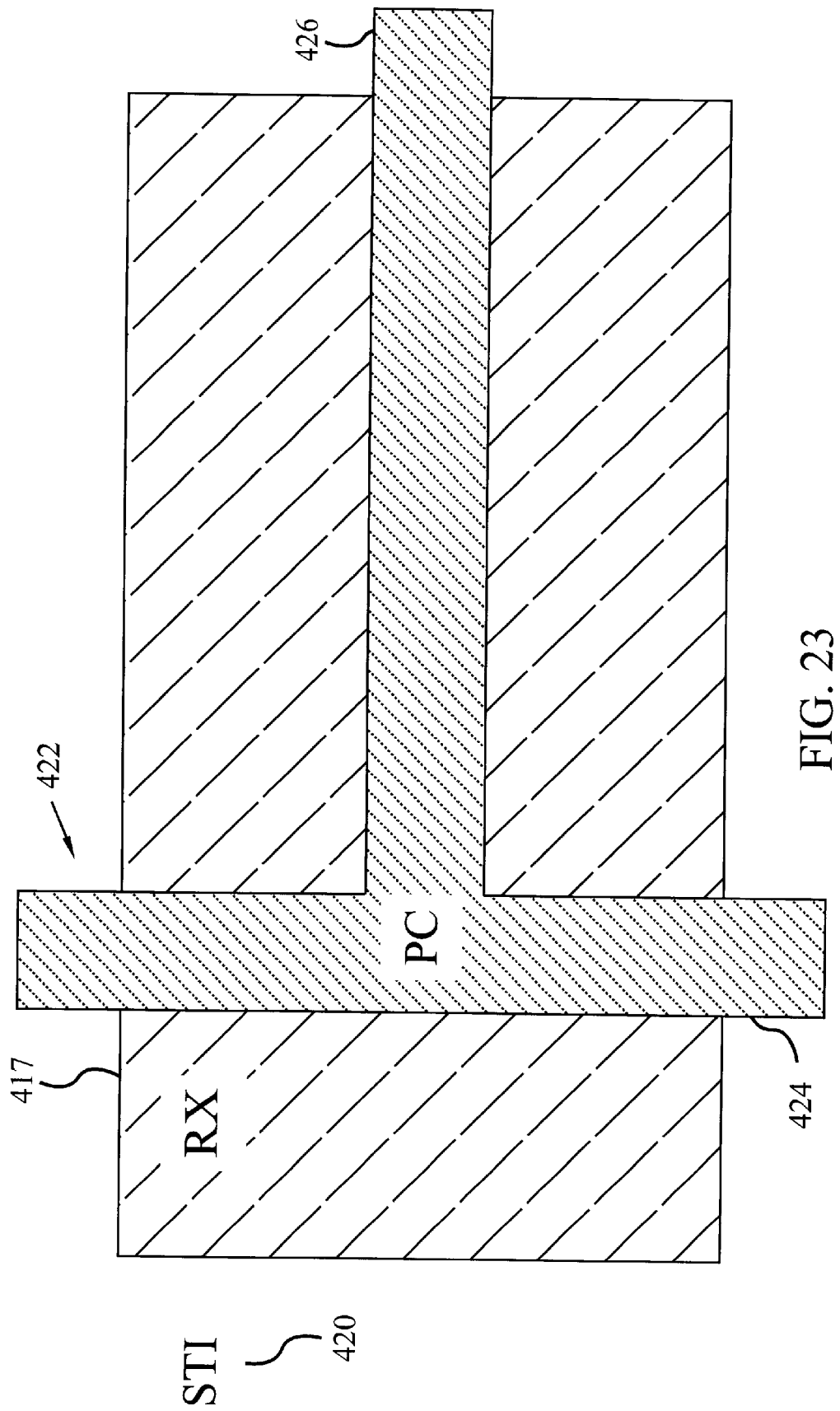
FIGS. 23–27 are top views of a fourth exemplary body contact transistor during fabrication.

Referring now to FIG. 22, a fourth method 400 for fabricating a transistor according to the present invention is illustrated. Method 400 removes a portion of the gate layer and replaces it with an insulative layer in regions between the transistor and the body contact. In a first step 402 of method 400, a starting substrate is patterned and provided with isolating trenches in a conventional manner. FIG. 23 shows an exposed active area 417 surrounded by an STI trench 420. One of ordinary skill in the art will recognize this as part of a conventional transistor fabrication process.

Returning to FIG. 22, a second step 404 of method 400 is to deposit and pattern a gate conductor. This too forms part of a conventional fabrication process. Referring back to FIG. 23, a gate 422 includes a horizontal arm 424 and a vertical leg 426. Gate 422 may comprise polysilicon, but may also be constructed of any other suitable gate conductor material, such as silicon germanium or a metal. In the pictured embodiment, gate 422 has a T-shaped body, although other bodies, such as H-shaped bodies, may also be used, as has been mentioned.

Figure 24:
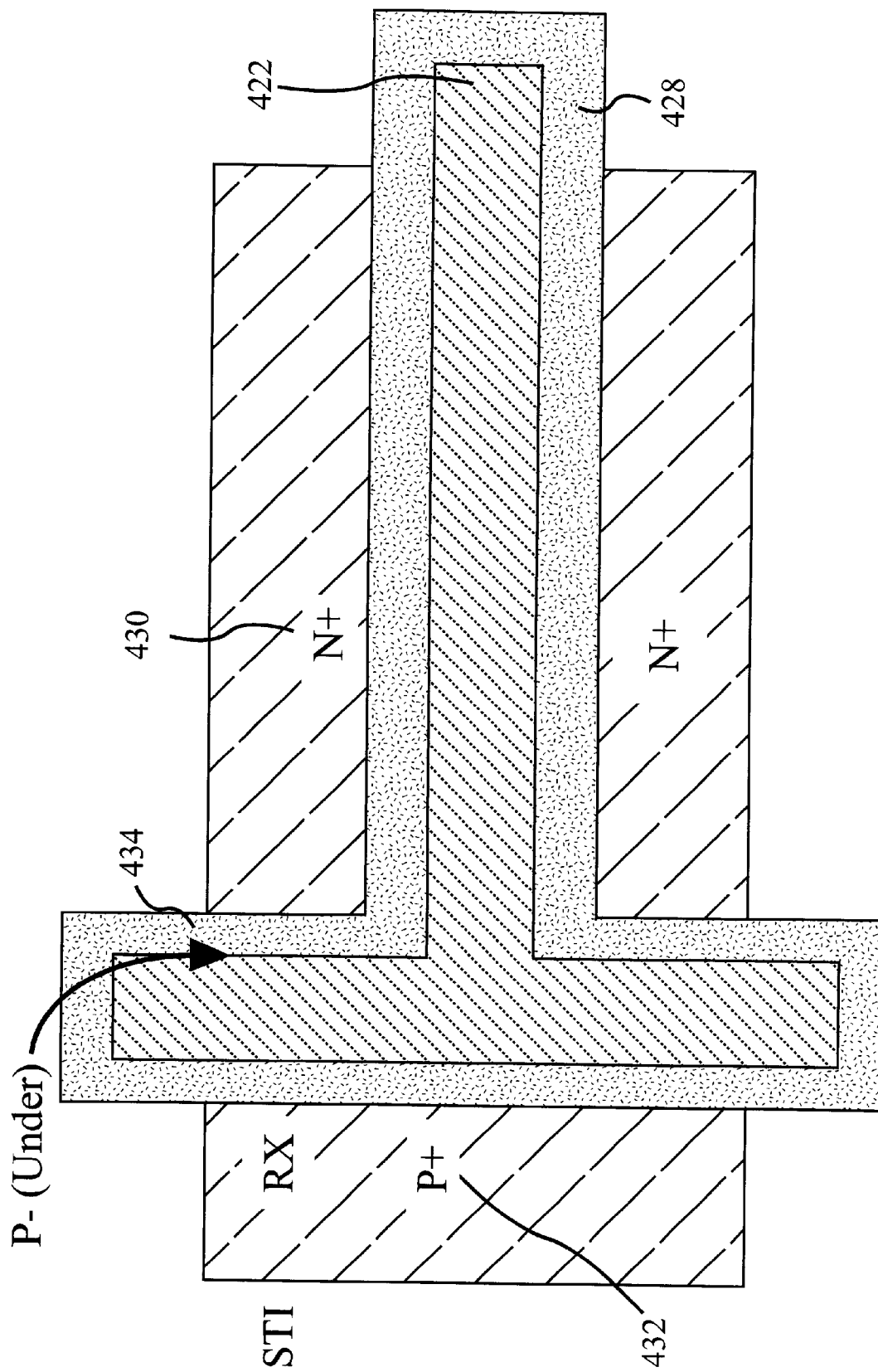

Returning again to FIG. 22, a third step 406 of method 400 is to install spacers, implants, and silicide. Like steps 402 and 404, step 406 represents part of a conventional fabrication process. FIG. 24 indicates that a sidewall spacer 428 surrounds gate 422. Source/drain implants 430 and a body contact implant 432 rest on active area 417. An arrow 434 indicates that the underlying substrate is left at the native doping of the well.

Figure 25:
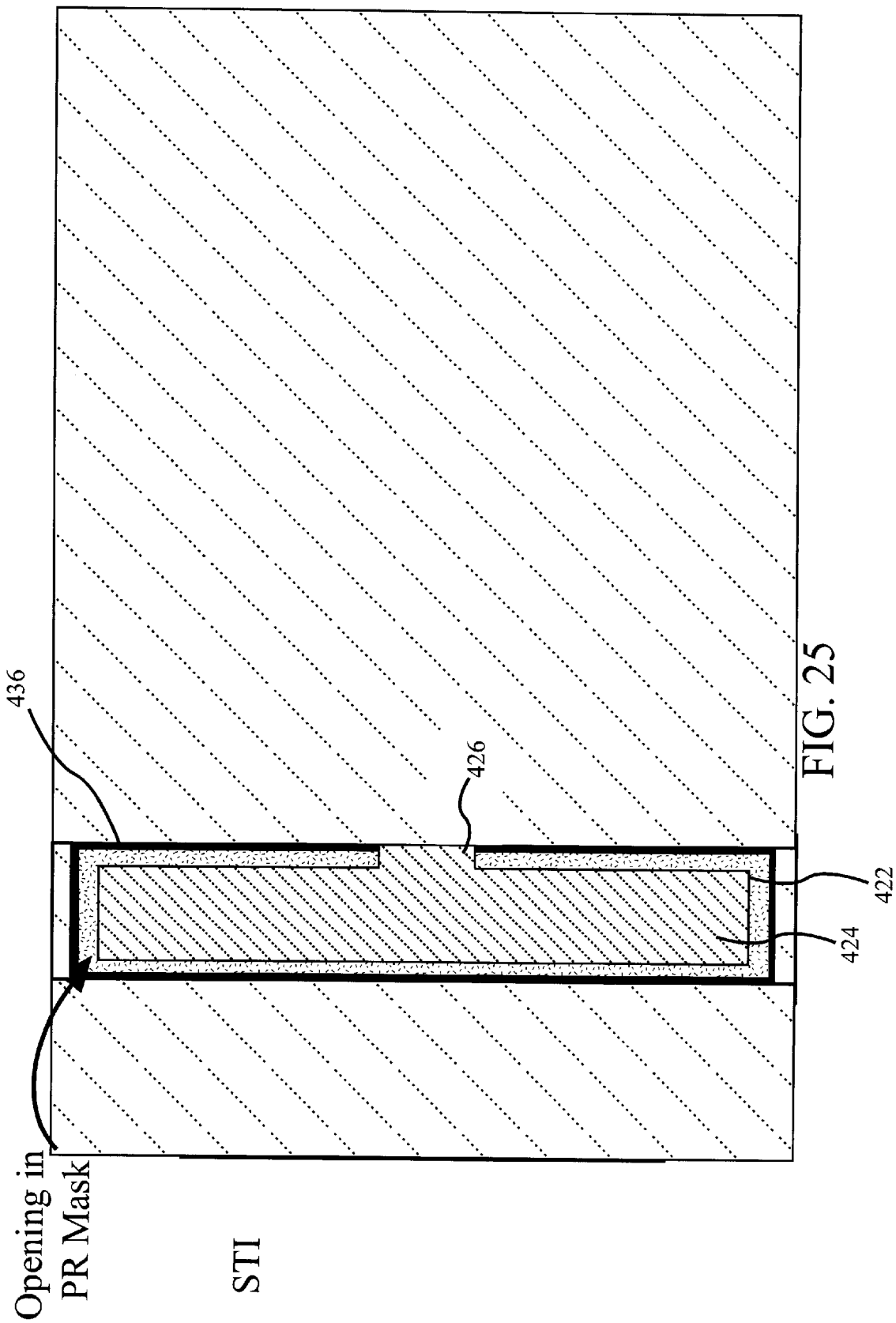
Figure 26:
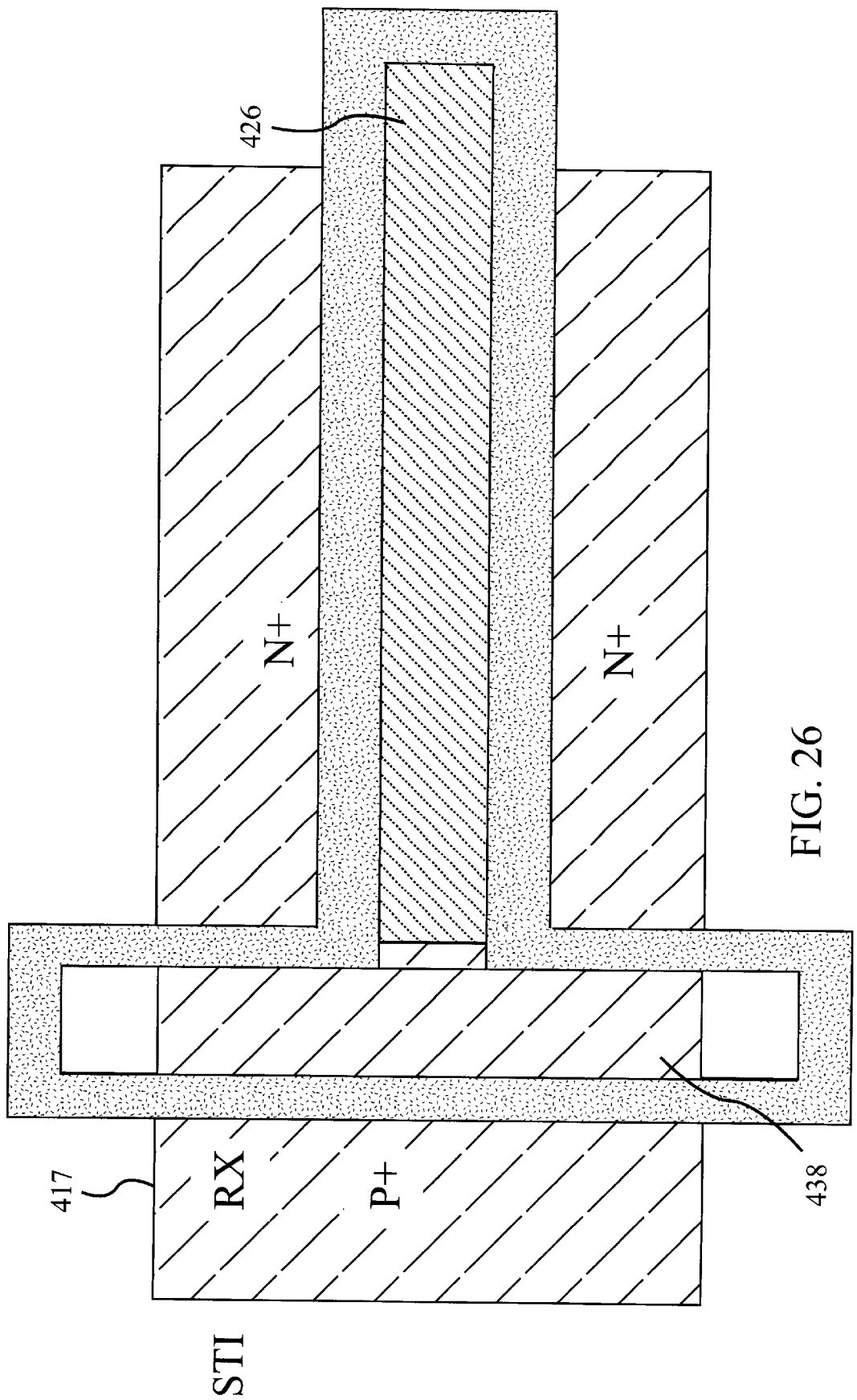

In FIG. 22, a fourth step 408 of method 400 is to apply a gate mask adapted to remove a portion of the gate conductor material, and a fifth step 410 is to etch the gate conductor in accordance with the mask applied in step 408. FIG. 25 shows that a gate mask 436 has been deposited over gate 422. Note that gate mask 436 entirely exposes horizontal arm 424 and exposes just a small portion of vertical leg 426, which allows for normal dimensional on alignment errors. FIG. 26 depicts active area 417 after the etching step has been completed. An area 438 is the former location of horizontal arm 424 of gate 422. Arm 424 has been etched away and no longer exists on active area 417. Vertical leg 426 has been left behind in the etch process, and occupies the position it did before the performance of fifth step 410. By removing horizontal arm 424, method 400 eliminates a significant source of parasitic capacitance, leading to a more efficient product.

Figure 27:
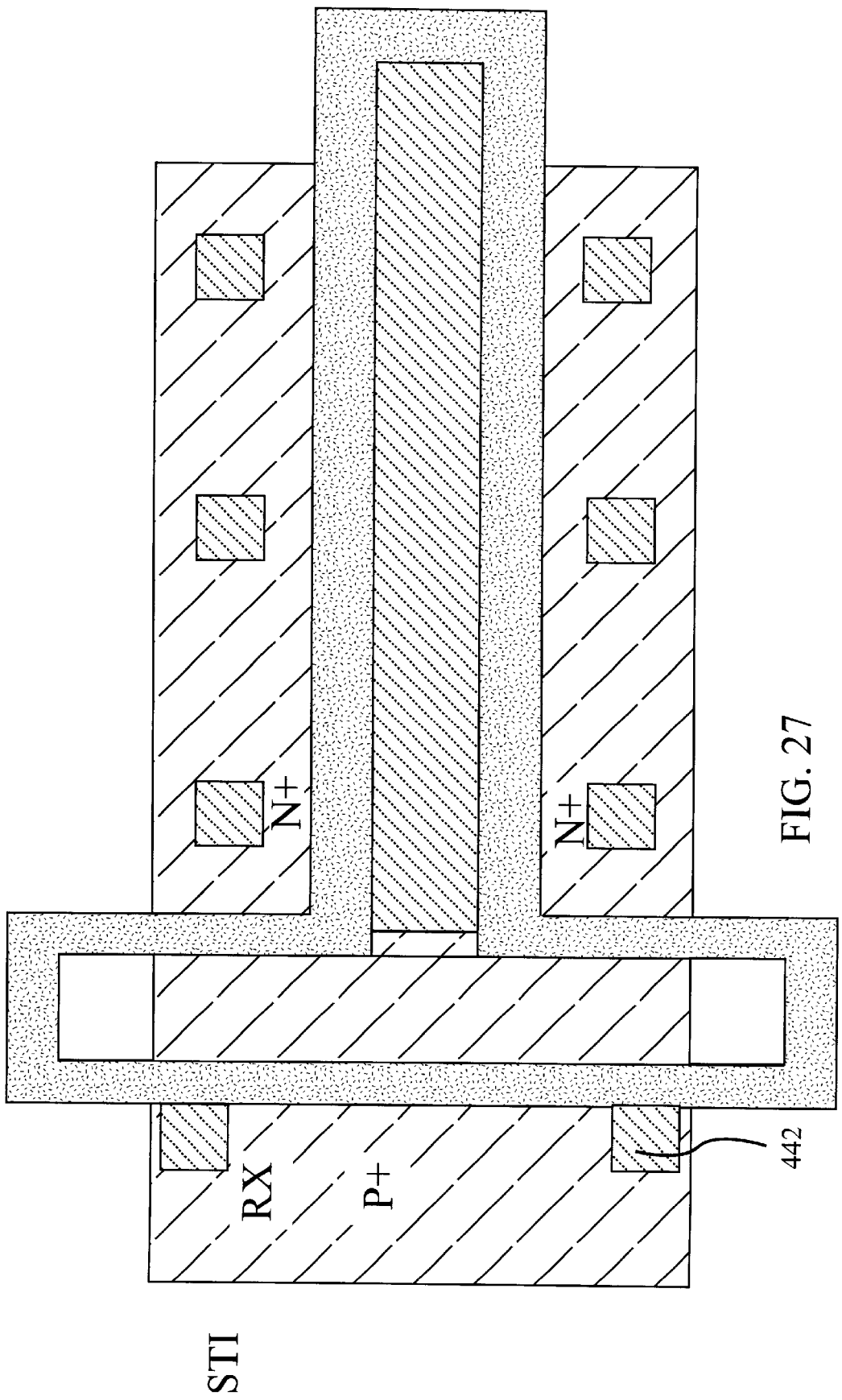

Returning to FIG. 22, a sixth step 412 of method 400 involves conventional BEOL processing and contact implantation. Active area 417 after sixth step 412 has been performed is depicted in FIG. 27, where interconnects 442 have been installed. Interconnects 442 serve as connections to the body contact area, and may be formed in any conventional manner.

Figure 28:
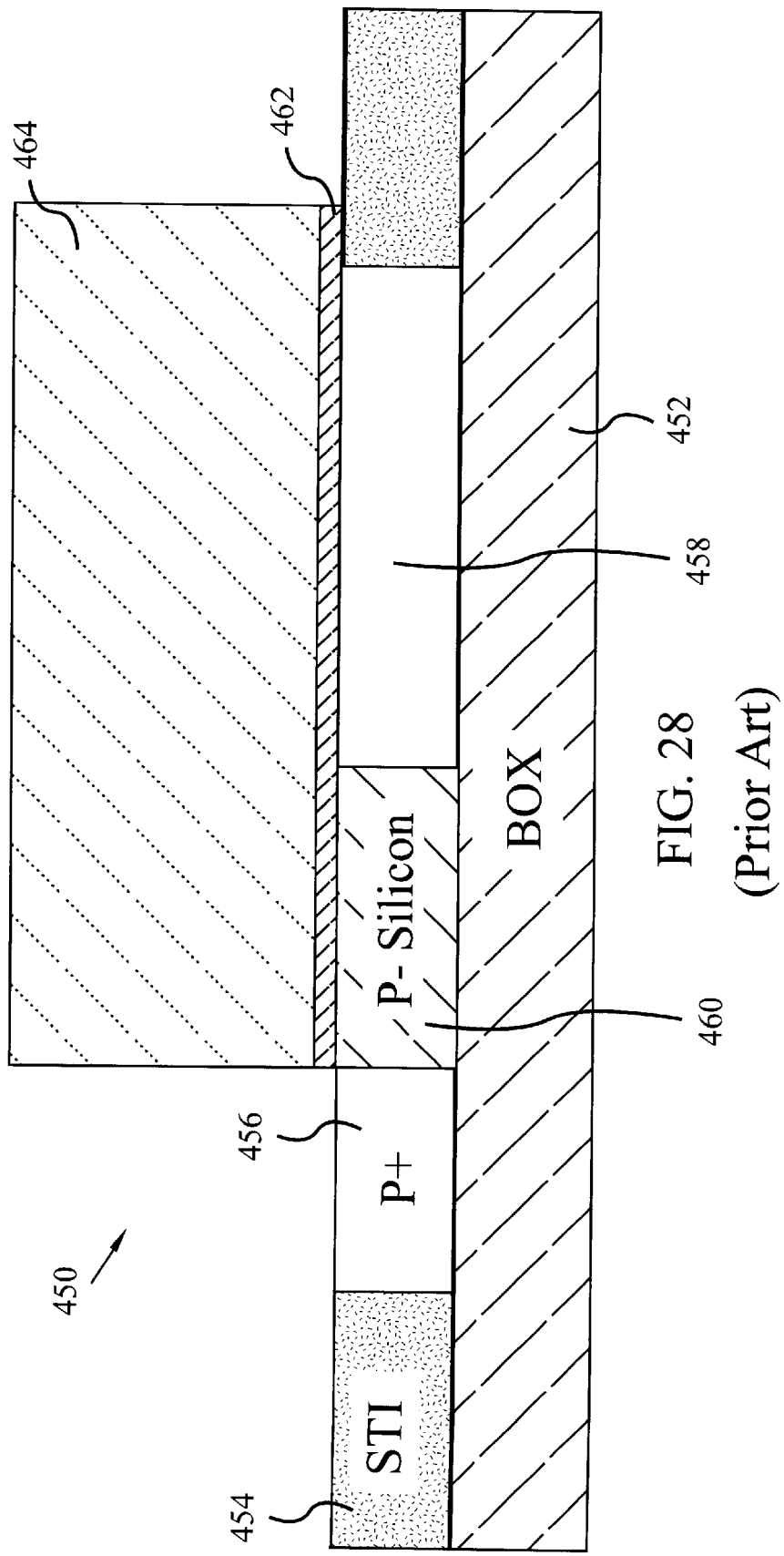
FIG. 28 is a cross-sectional side view of an existing thin oxide T-body contact.

Referring now to FIG. 28, a cross-sectional side view of a conventional T-body contact 450 is shown. A buried oxide (BOX) layer 452 underlies a STI trench 454. A body contact region 456 and a source/drain region 458 rest on BOX layer 452. A native doping region 460 is formed in between regions 456 and 458. Conventional T-body contact 450 further includes a thin gate-oxide layer 462, over which is located gate conductor 464. As has been mentioned in a number of places in the foregoing description, a great deal of parasitic capacitance may build up between the various layers of conventional T-body contact 450.

Figure 29:
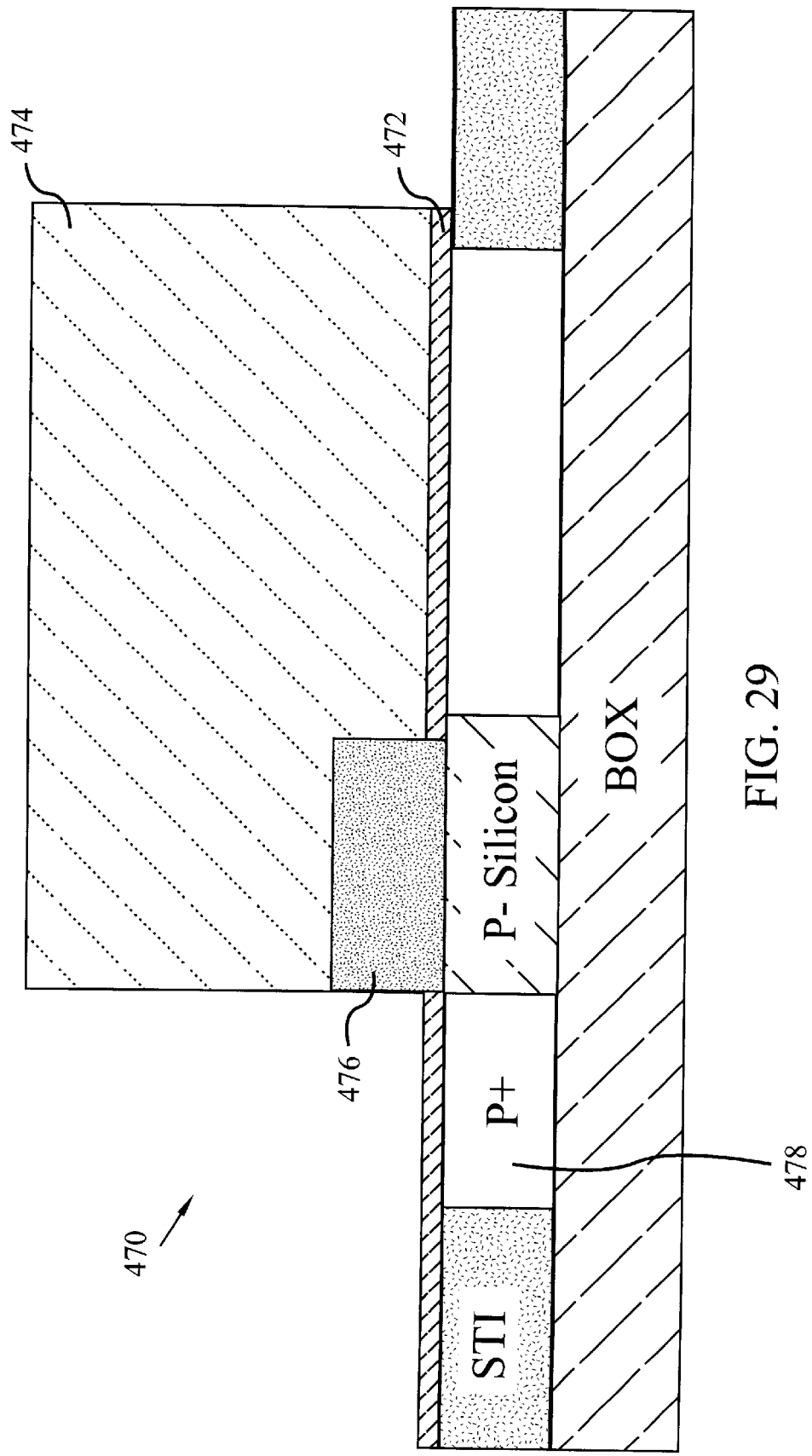
FIG. 29 is a cross-sectional side view of fifth exemplary body contact.

Referring now to FIG. 29, a T-body contact 470 according to another embodiment of the present invention is illustrated. This embodiment may be referred to a dual gate (DG) embodiment because it comprises dual insulative structures, i.e., dual gate oxide materials, having different thicknesses. In other embodiments, more than two different thicknesses of insulative materials may be used. T-body contact 470 differs from conventional T-body contact 450 in that a thick gate-oxide layer 476 has replaced a portion of a thin gate-oxide layer 472 between a gate conductor 474 and a body contact region 478. Thick gate-oxide layer 476 reduces capacitance between the various layers of T-body contact 470 so that there is less capacitance in the configuration of FIG. 29 than there is in the configuration of FIG. 28. However, the FIG. 29 configuration may not reduce capacitance as effectively or to the degree that certain other embodiments of the present invention do.

Figure 30:
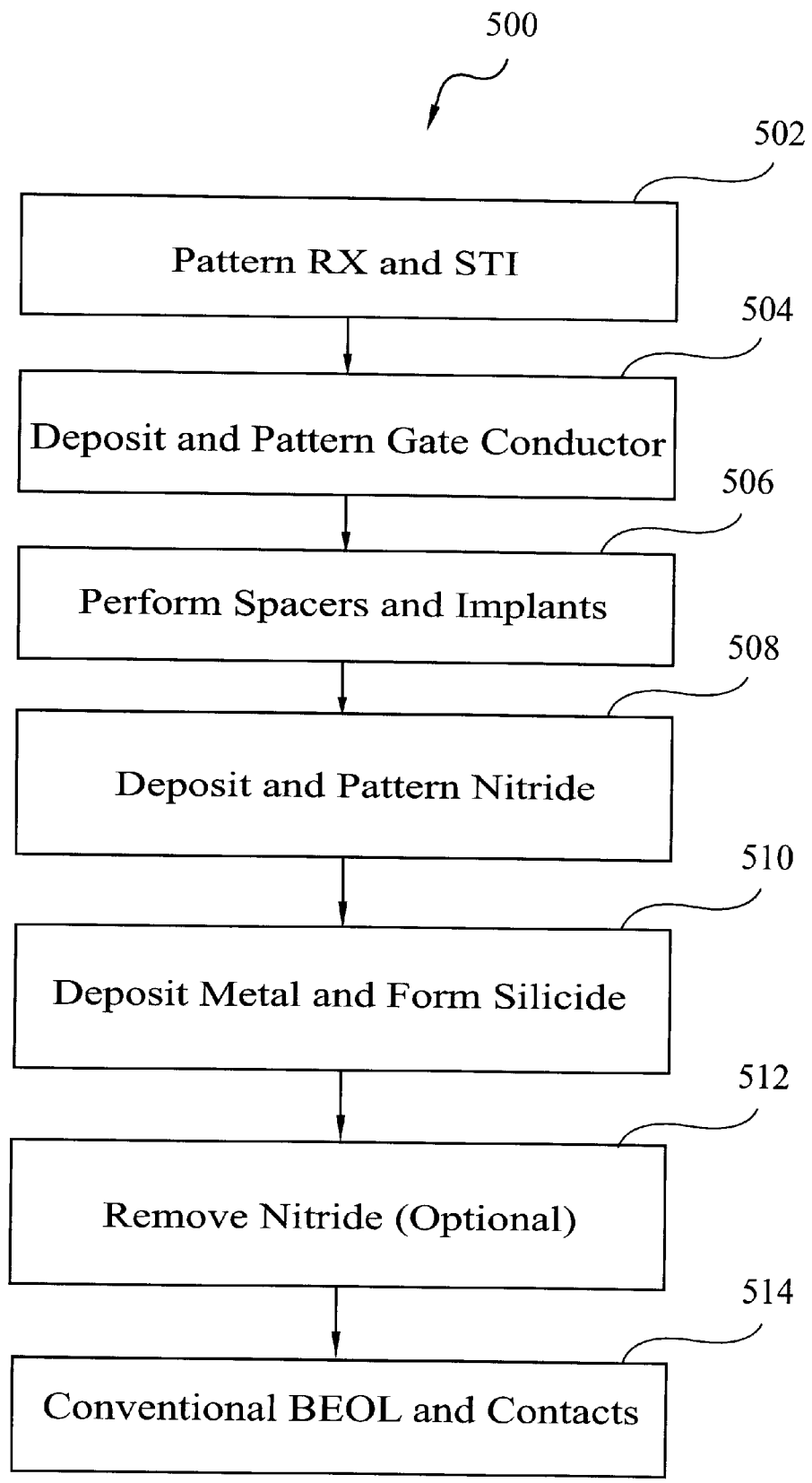
FIG. 30 is a flow diagram illustrating a fabrication method according another embodiment of the present invention.

Turning to FIG. 30, a method 500 for fabricating a transistor according to another embodiment of the present invention is illustrated. Method 500 forms a layer of nitride between the body contact region and the source/drain region of the transistor which prevents silicide from forming between the two regions. This leaves a gap that acts as an insulator. A first step 502 and a second step 504 of method 500 mirror first and second steps 402 and 404 of method 400, and will thus not be further described here. A third step 506 of method 500 is to perform spacers and implants, as is conventional in the fabrication process. A fourth step 508 of method 500 is to deposit a nitride layer and pattern it with an OP mask. A fifth step 510 is to deposit metal and form silicide, as is conventional during fabrication. An optional sixth step 512 is to remove the nitride layer, but nitride may also be left in place if desired without affecting the operation of the transistor of this embodiment. A seventh step 514 is to perform conventional BEOL processing and deposit contacts. Method 500 will be further discussed in connection with FIGS. 31 and 32 below.

Figure 31:
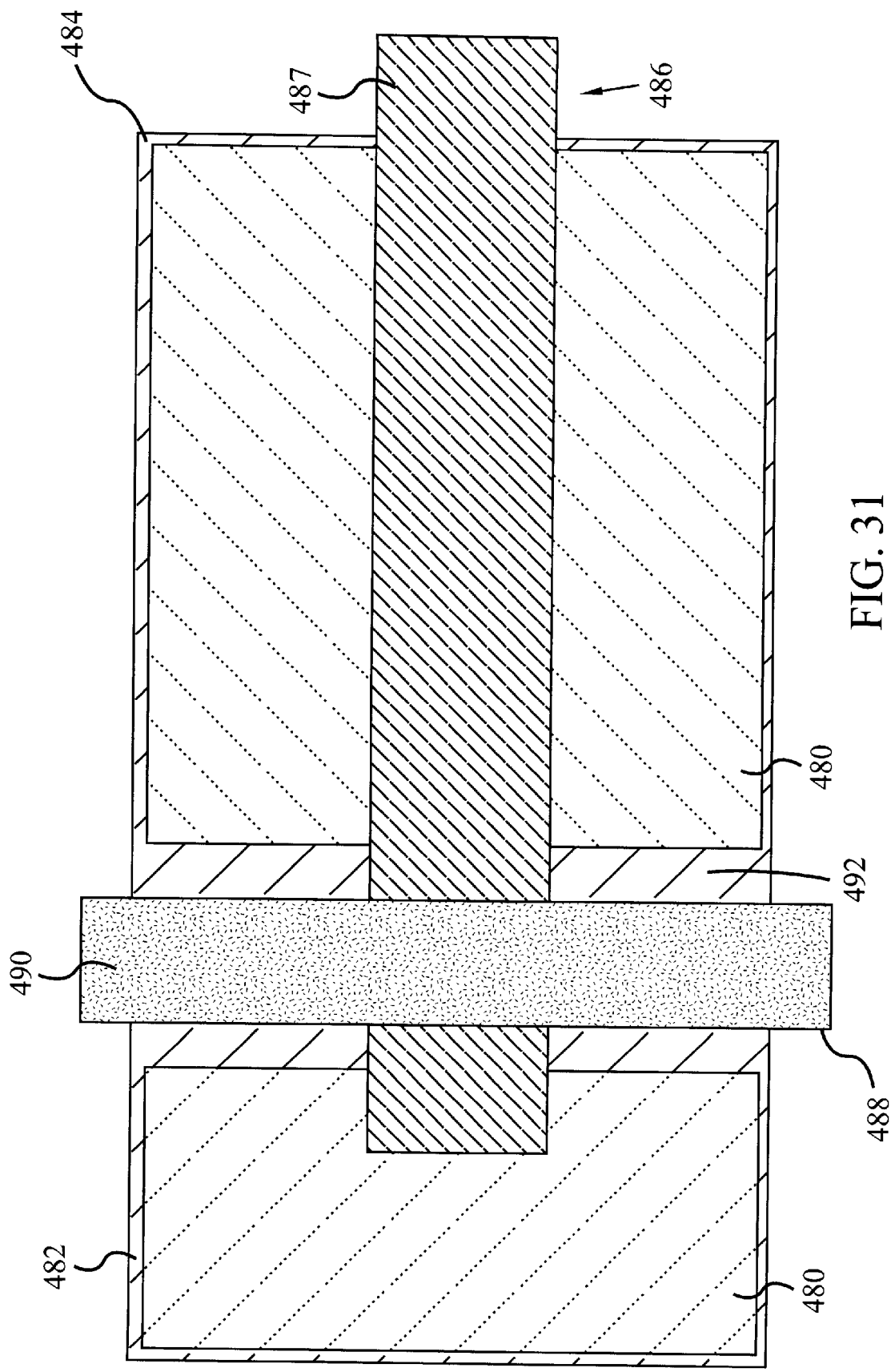
FIG. 31 is a top view of a sixth exemplary body contact.

FIG. 31 depicts a T-body contact according to an embodiment of the present invention created by method 500. In this embodiment, T-body 486 comprises a horizontal leg 487 and a vertical leg 488, as in certain of the other embodiments of the present invention discussed herein. In this embodiment, only horizontal leg 487 comprises a gate conductor; vertical leg 488 comprises a thin nitride (OP) shape 490 that is deposited after the gate conductor shape is in place.

OP shape 490 temporarily leaves a film of nitride between a body contact region 482 and a source/drain region 484 before the formation of a silicide layer 480 on exposed silicon conductors. This nitride film prevents silicide from forming, thus preventing silicide layer 480 from bridging across regions 482 and 484. After silicide is formed, OP shape 490 may be removed, although in at least one embodiment it may be left in place. Whether or not OP layer 490 is removed, its presence during the fabrication process leaves a gap 492 in silicide layer 480. Gap 492 is sufficiently wide that silicide will not wander between regions 482 and 484, even if OP shape 490 is removed prior to subsequent MOL processing. Thus, in this embodiment a portion of the gate conductor is once again replaced with an insulative structure, but the replacement occurs after the gate is formed, and the insulative structure need not be left in place.

Figure 32:
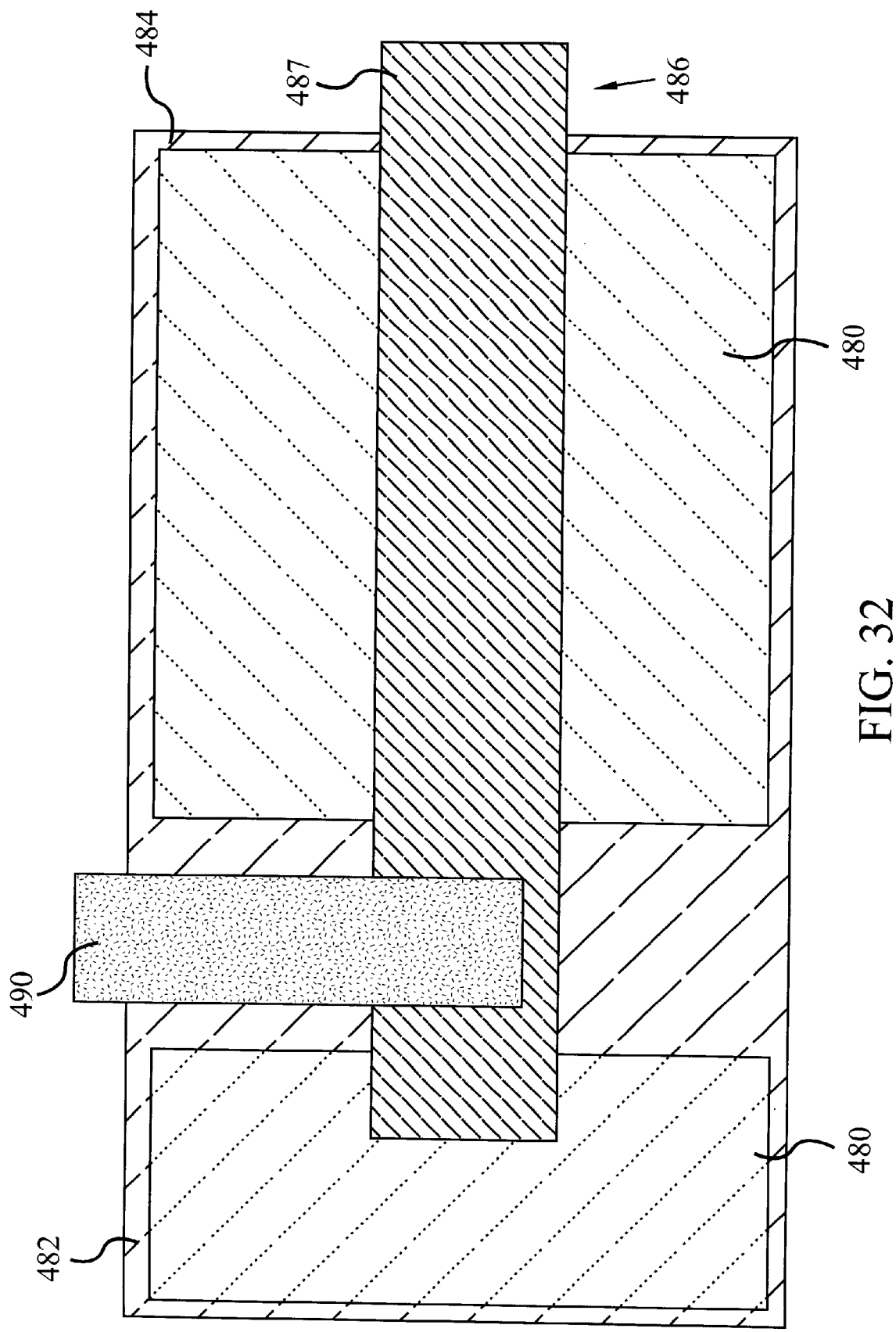
FIG. 32 is a top view of another embodiment of the body contact of FIG. 31.

Turning now to FIG. 32, an alternate configuration of the OP embodiment is shown. In this embodiment, OP shape 490 has been reduced in length to resemble an L-shape rather than a T-shape, so as to facilitate shorting body 486 to source region 484. Some applications require this configuration, including input transistors to sense amplifiers and current mirrors. This L-shape configuration may be used with any of the embodiments of the present invention.

A variety of fabrication methods for a transistor according to the present invention have been described. Other methods may also exist. The foregoing description has described selected embodiments of a body contact structure that overcomes the disadvantages of the prior art by utilizing an insulating structure between the body contact portion of the active area and the transistor portion of the active area. In particular, the description herein has discussed a raised insulative structure formed across the active area that isolates the portion of the area where transistors are formed from the portions of the active area where the body contact is formed. The body contact produced by these methods adds no significant gate capacitance to the device.

While the invention has been particularly shown and described with reference to selected embodiments thereof, it will be readily understood by one of ordinary skill in the art that, limited only by the appended claims, various changes in form and details may be made therein without departing from the spirit and scope of the invention.

We claim:

1. A silicon-on-insulator semiconductor device comprising a source, a drain, a first gate having a first thickness, and a body contact formed in a substantially coplanar semiconducting substrate, wherein said source and said drain are separated from said body contact by a structure comprising an insulator and insulative spacers, said insulator not forming a part of said gate, and wherein said insulative spacers are in direct mechanical contact with external surfaces of said insulator such that an interior portion of said insulator is between said spacers.

2. The invention of claim 1 wherein said first gate is replaced with a second gate having a second thickness, said second thickness greater than said first thickness, said second gate comprising said insulator.

3. The invention of claim 1 wherein said insulator has a lower dielectric constant than said first gate.

4. The invention of claim 1 further comprising a metal layer shorting said body contact to either said source or said drain.

5. The invention of claim 1 wherein said insulator comprises an isolation material, said isolation material surrounding said semiconductor device.

6. The invention of claim 5 wherein said isolation material comprises a STI trench.

7. The invention of claim 1 wherein said spacers interrupt a continuity of a silicide material.

8. The invention of claim 7 wherein said spacers are continuous with spacers extending adjacent to edges of said gate conductor.

9. The invention of claim 1 wherein said insulator comprises a layer of insulation with no gate conductor on said insulation.

10. The invention of claim 9 wherein said layer of insulation comprises a layer of oxide or nitride.

11. The invention of claim 9 wherein said layer of insulation is immediately adjacent to said gate conductor.

* * * * *